(12) United States Patent
Liao et al.

(10) Patent No.: US 10,510,875 B2
(45) Date of Patent: Dec. 17, 2019

(54) SOURCE AND DRAIN STRUCTURE WITH REDUCED CONTACT RESISTANCE AND ENHANCED MOBILITY

(71) Applicant: Taiwan Semiconductor Manufacturing Co., Ltd., Hsin-Chu (TW)

(72) Inventors: Chih-Teng Liao, Hsinchu (TW); Chih-Shan Chen, New Taipei (TW); Yi-Wei Chiu, Kaohsiung (TW); Chih Hsuan Cheng, Miaoli County (TW); Tzu-Chan Weng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/000,689

(22) Filed: Jun. 5, 2018

(65) Prior Publication Data
US 2019/0035908 A1    Jan. 31, 2019

Related U.S. Application Data

(60) Provisional application No. 62/539,188, filed on Jul. 31, 2017.

(51) Int. Cl.
*H01L 29/66* (2006.01)
*H01L 21/8234* (2006.01)
(Continued)

(52) U.S. Cl.
CPC .... *H01L 29/6681* (2013.01); *H01L 21/30625* (2013.01); *H01L 21/324* (2013.01);
(Continued)

(58) Field of Classification Search
CPC ............ H01L 29/6681; H01L 29/0653; H01L 29/0847; H01L 29/41791; H01L 29/66545;
(Continued)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

OTHER PUBLICATIONS

Yun Zheng, "Electronic Properties of Silicon Nanowires," IEEE Transactions on Electron Devices, vol. 52, No. 6, Jun. 2005, pp. 1097-1103.

*Primary Examiner* — Yosef Gebreyesus
(74) *Attorney, Agent, or Firm* — Haynes and Boone, LLP

(57) ABSTRACT

A method includes forming a fin structure on the substrate, wherein the fin structure includes a first fin active region; a second fin active region; and an isolation feature separating the first and second fin active regions; forming a first gate stack on the first fin active region and a second gate stack on the second fin active region; performing a first recessing process to a first source/drain region of the first fin active region by a first dry etch; performing a first epitaxial growth to form a first source/drain feature on the first source/drain region; performing a fin sidewall pull back (FSWPB) process to remove a dielectric layer on the second fin active region; and performing a second epitaxial growth to form a second source/drain feature on a second source/drain region of the second fin active region.

20 Claims, 48 Drawing Sheets

(51) Int. Cl.

| | |
|---|---|
| *H01L 21/324* | (2006.01) |
| *H01L 29/78* | (2006.01) |
| *H01L 29/417* | (2006.01) |
| *H01L 29/08* | (2006.01) |
| *H01L 21/306* | (2006.01) |
| *H01L 21/8238* | (2006.01) |
| *H01L 27/092* | (2006.01) |
| *H01L 29/06* | (2006.01) |

(52) U.S. Cl.
CPC ........ *H01L 21/823418* (2013.01); *H01L 21/823431* (2013.01); *H01L 21/823814* (2013.01); *H01L 21/823842* (2013.01); *H01L 27/092* (2013.01); *H01L 29/0653* (2013.01); *H01L 29/0847* (2013.01); *H01L 29/41791* (2013.01); *H01L 29/66545* (2013.01); *H01L 29/785* (2013.01); *H01L 29/7848* (2013.01)

(58) Field of Classification Search
CPC ........ H01L 29/7848; H01L 29/785; H01L 21/30625; H01L 21/324; H01L 21/823418; H01L 21/823431; H01L 21/823842
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2005/0035402 A1* | 2/2005 | Venkatraman .............. H01L 21/823487 257/330 |
| 2016/0358911 A1* | 12/2016 | Chen ............ H01L 27/0886 |

* cited by examiner

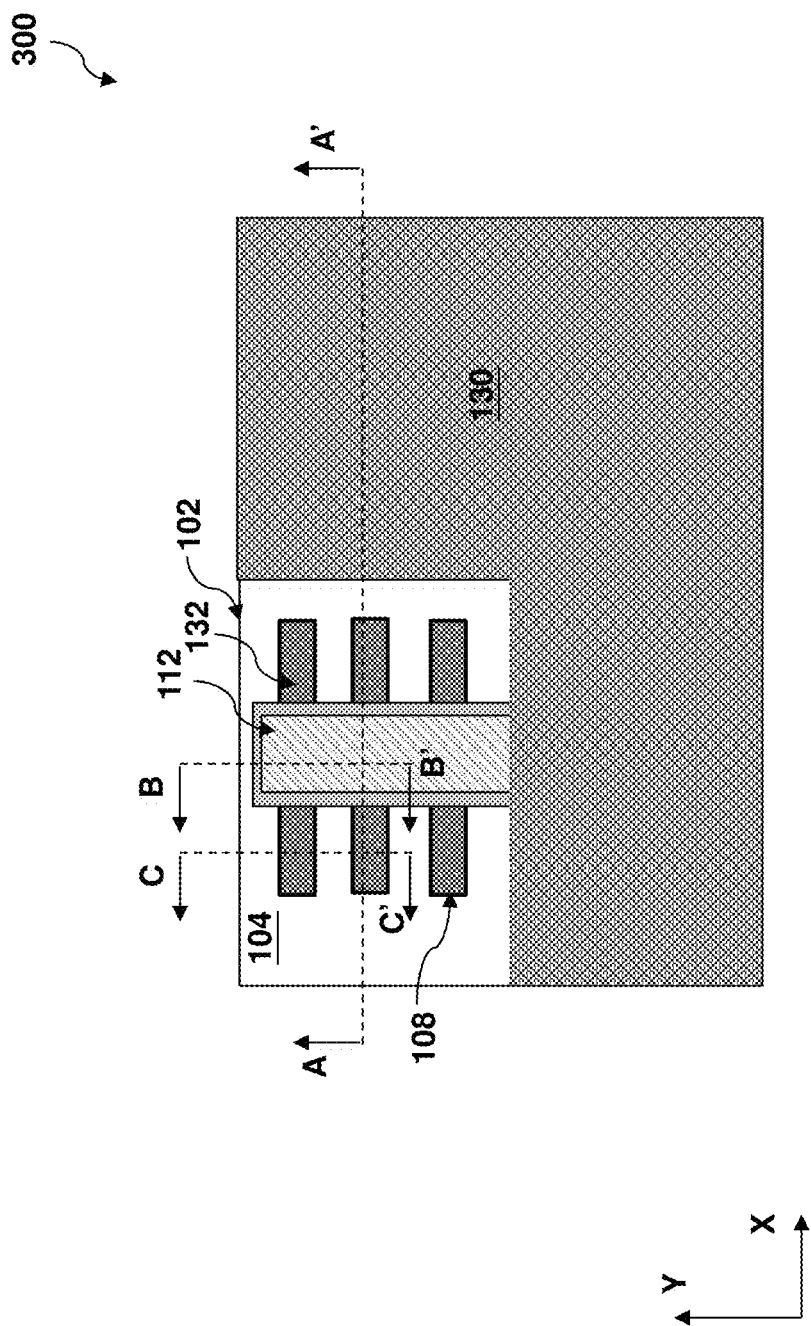

SOURCE AND DRAIN STRUCTURE WITH REDUCED CONTACT RESISTANCE AND ENHANCED MOBILITY

CROSS REFERENCE

This application claims the benefit of U.S. Provisional Application 62/539,188, entitled "SEMICONDUCTOR DEVICES WITH RESPECTIVE PROFILES AND METHOD MAKING THE SAME," filed Jul. 31, 2017, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. By way of example, the FinFET fabrication process may include forming epitaxial grown source and drain features by etching and selective epitaxial growth to have strain effect. Thus formed source and drain features by the existing method may cause defect issue, such as dislocation variation, and degrade device performance. In some cases, the source/drain features are designed differently due to respective specification requirements. The existing method is not effectively to form various source and drain features with respective characteristics. Other issues may include contact resistance. Therefore, what is needed is a structure and a method making the same to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, and 13A are top views of the workpiece at various fabrication stages of the method making the workpiece according to various aspects of the present disclosure.

DETAILED DESCRIPTION

Figure 1:
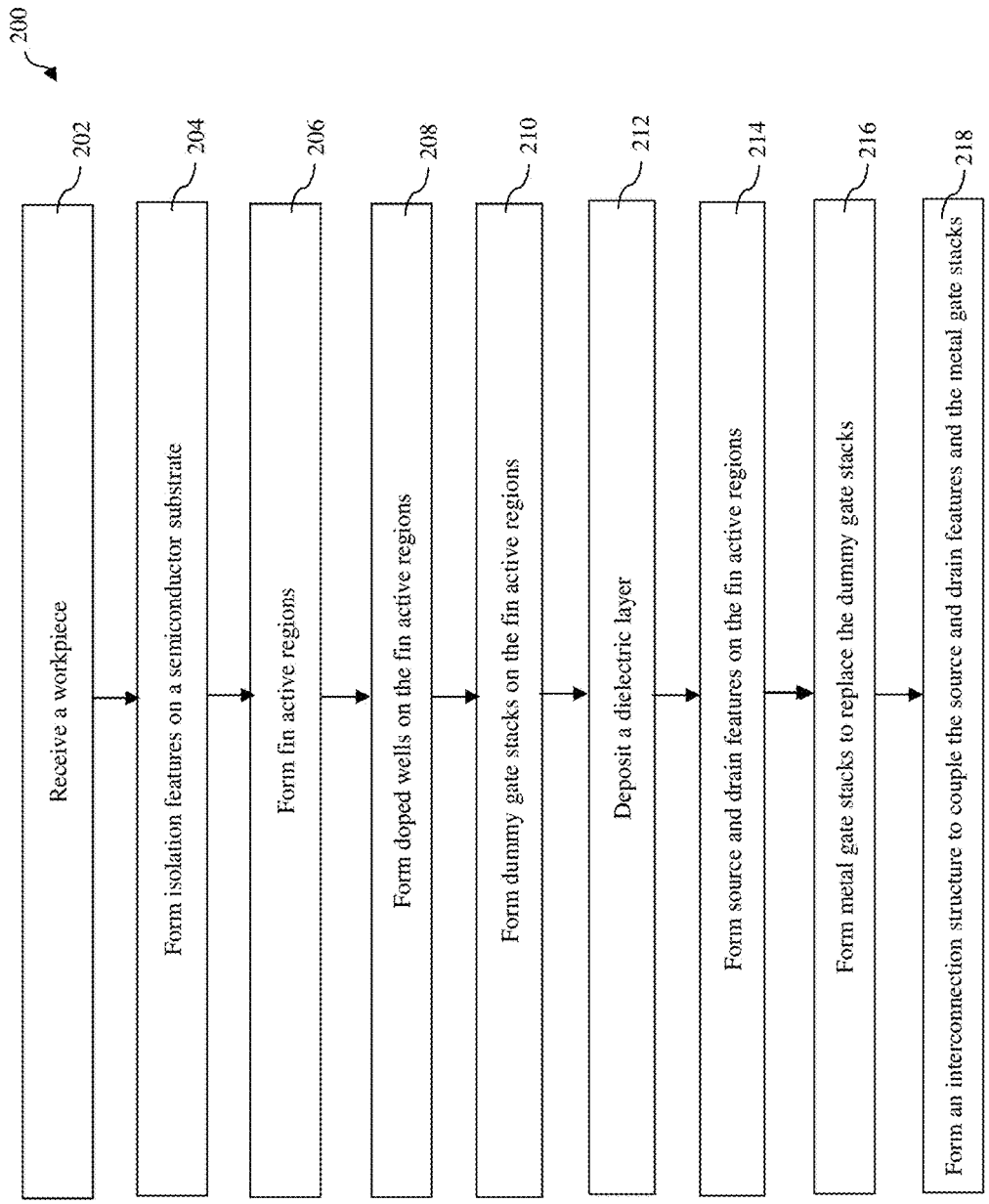
FIGS. 1 and 2 are flow diagrams of a method of fabricating a workpiece according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

It is noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (π-gate) devices.

The present disclosure is generally related to semiconductor devices and fabrication. More particularly, some embodiments are related to forming source and drain features, such as along with device fin active regions. Furthermore, the disclosed method provides an approach to form source and drain features with increased strain effect, decreased contact resistance and further with additional freedom to form source and drain features with respective characteristics. In some examples, these source and drain features are formed by a procedure including two step etching: the first etching step to etch the fin for recessing the source and drain regions; and the second etching step to remove the dielectric layer on the sidewalls of the fin active regions.

Embodiments of the present disclosure offer various advantages, though it is understood that other embodiments may offer different advantages, not all advantages are necessarily discussed herein, and no particular advantage is required for all embodiments. In at least some embodiments, by forming the expitaxial grown source and drain features, the carrier mobility is increased and the device performance is enhanced.

Figure 2:
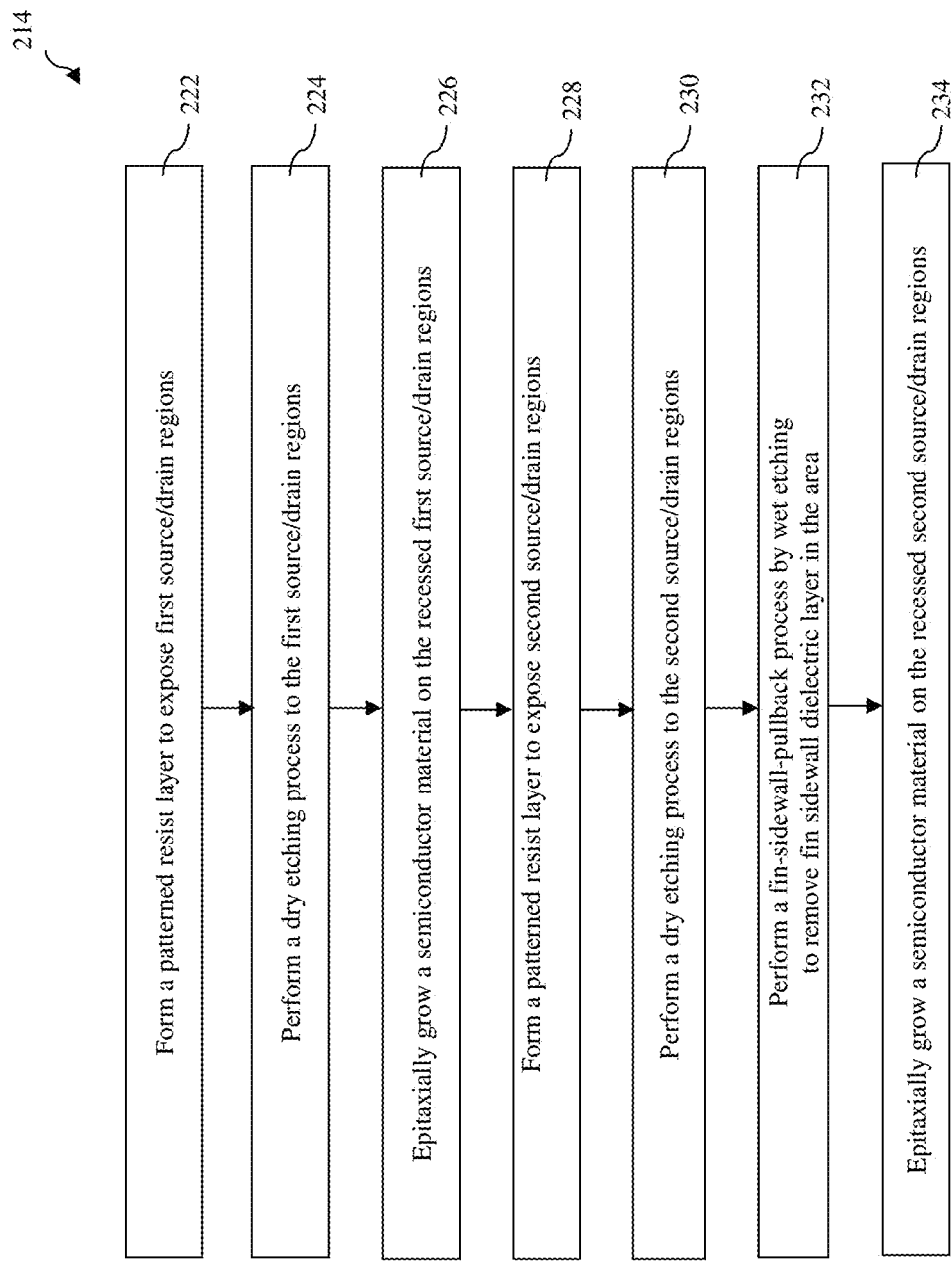
Figure 13A:
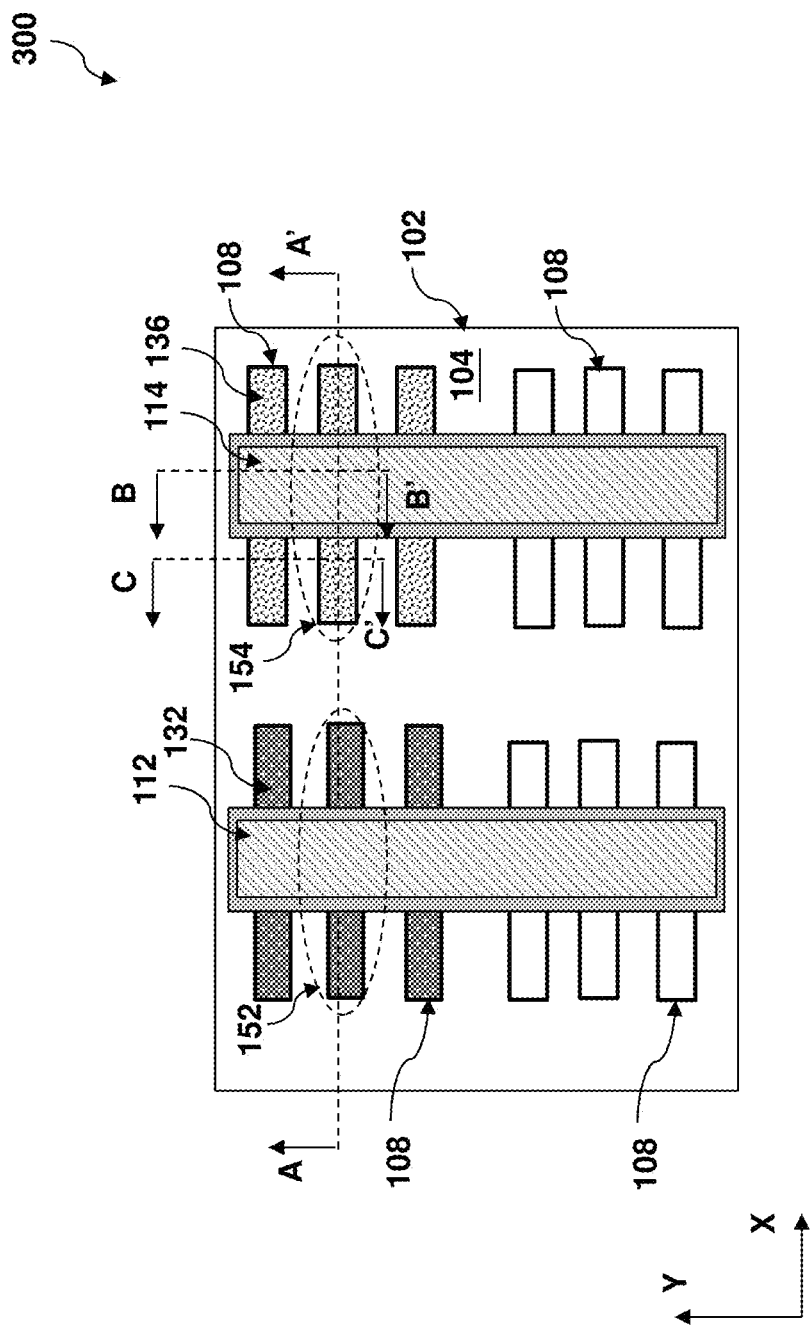
Figure 13B:
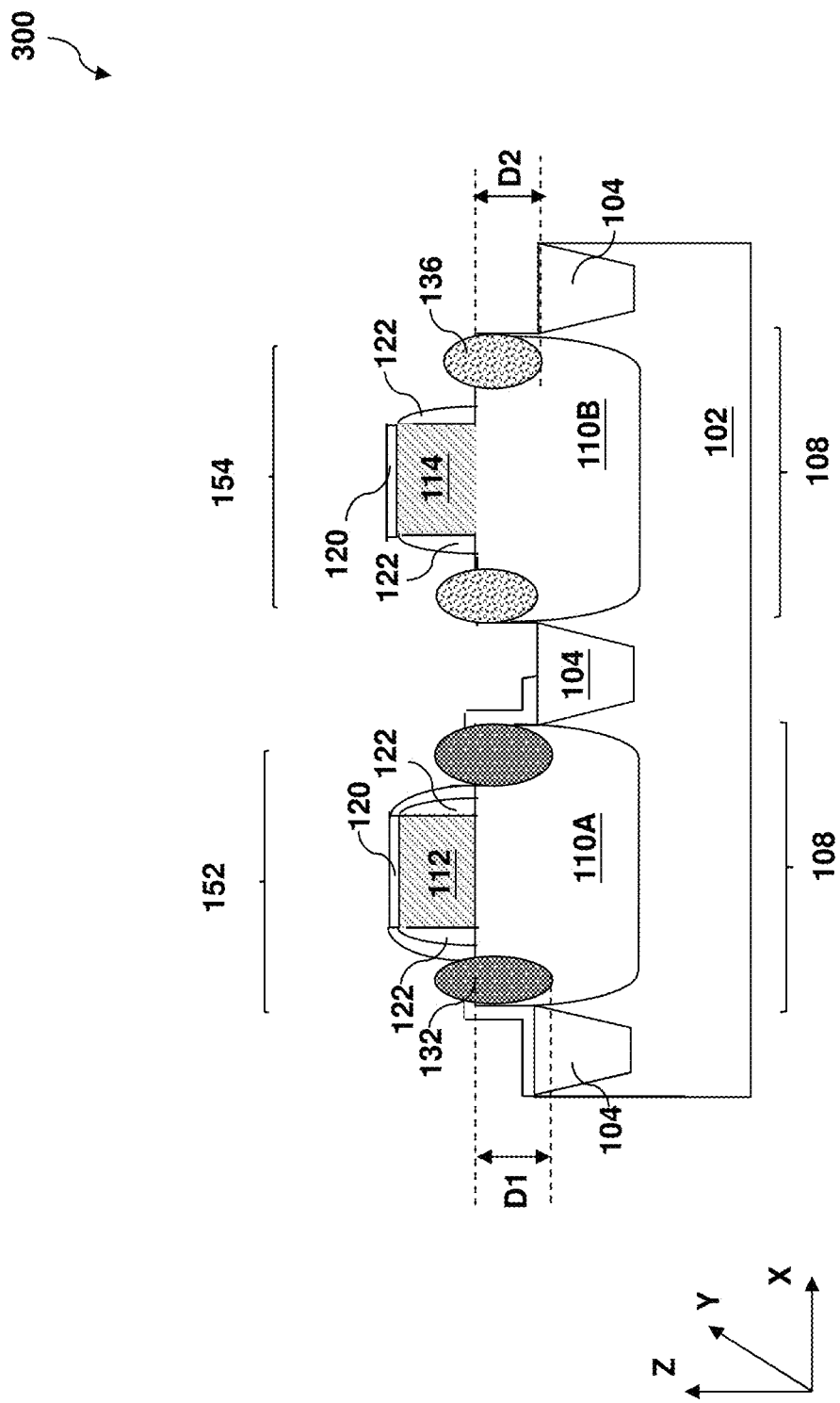
Figure 13C:
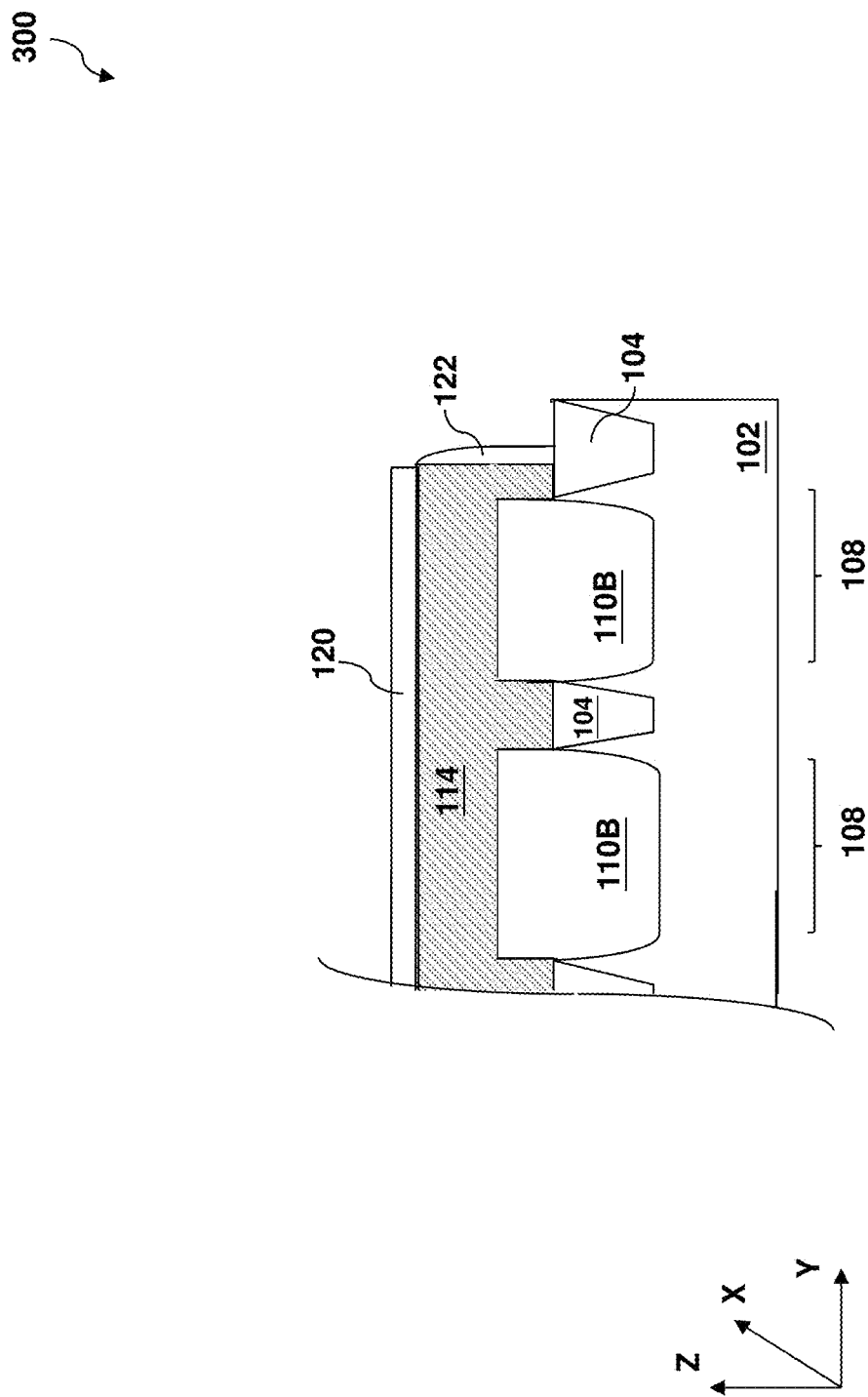
Figure 13D:
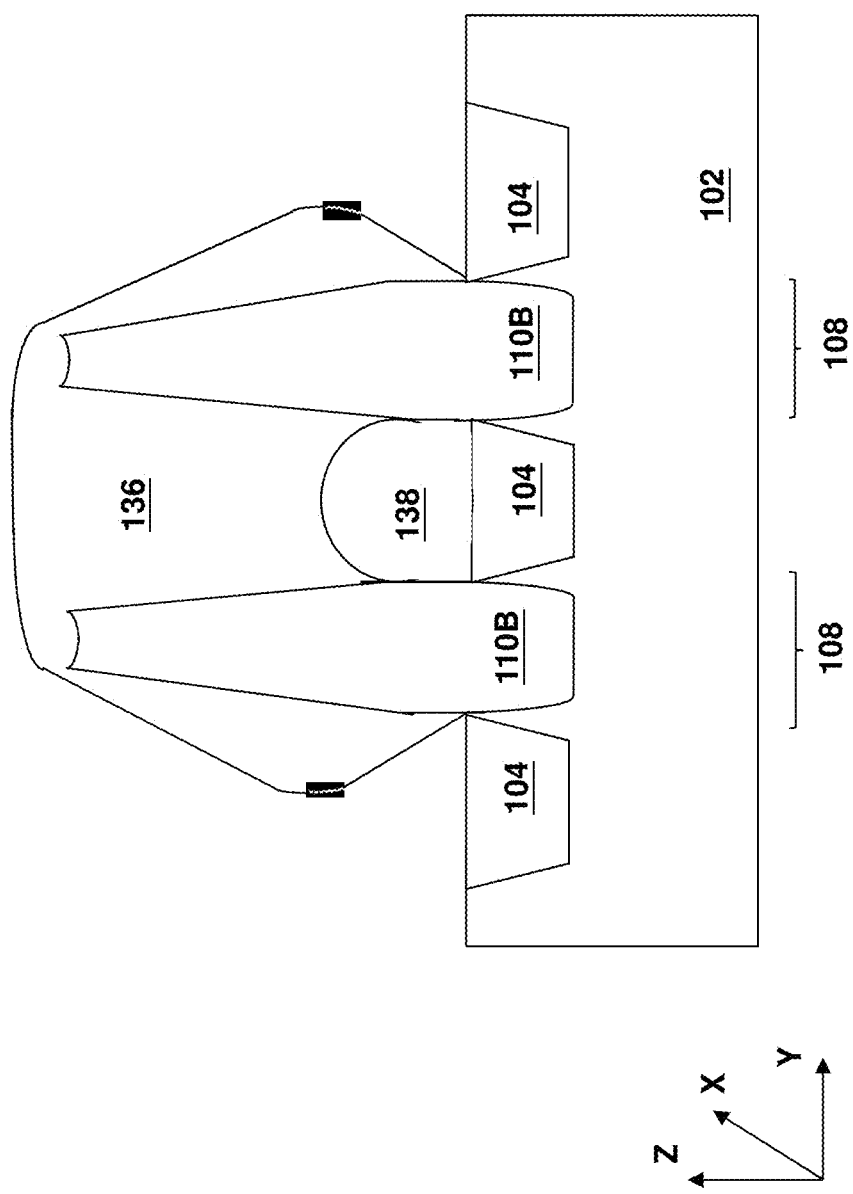
Figure 14A:
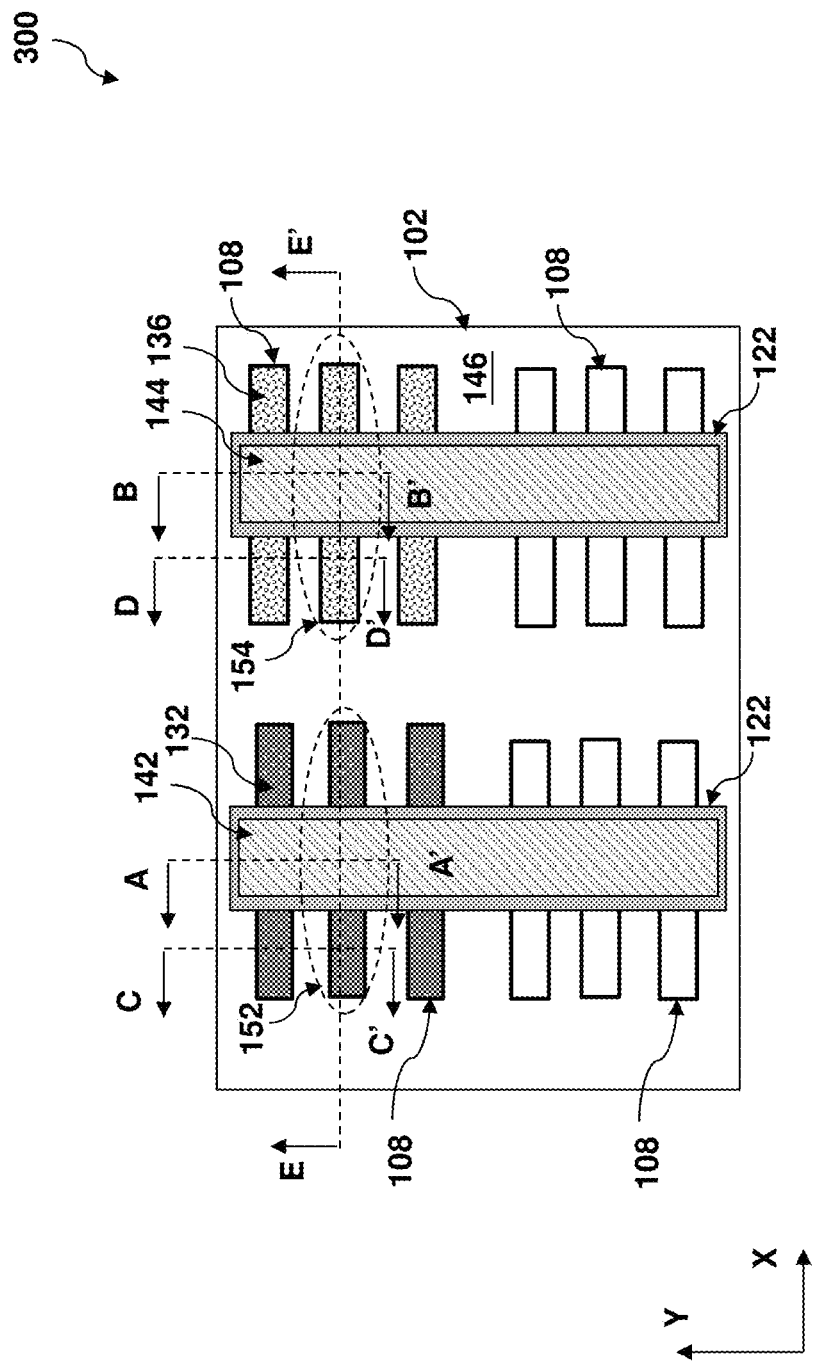
FIG. 14A is a top view of the workpiece at a stage of the method of fabricating the workpiece according to various aspects of the present disclosure.

FIG. 1 is a flowchart of the method 200 for making a workpiece (also referred to as a semiconductor structure) 300 having various FETs. FIG. 2 is a flowchart of the method 214 for making the source/drain features of the semiconductor structure 300. FIGS. 3A, 4A, 5A, 6A, 7A, 8A, 9A, 10A, 11A, 12A, and 13A are top views of the workpiece 300 at various fabrication stages. FIGS. 3B, 4B, 5B, 6B, 7B, 8B, 9B, 10B, 11B, 12B, and 13B are sectional views of the workpiece 300 taken along the dashed line AA' at various fabrication stages. FIGS. 5C, 6C, 7C, 8C, 9C, 10C, 11C, 12C, and 13C are sectional views of the workpiece 300 taken along the dashed line BB' at various fabrication stages. FIGS. 5D, 6D, 7D, 8D, 9D, 10D, 11D, 12D, and 13D are sectional views of the workpiece 300 taken along the dashed line CC' at various fabrication stages. FIG. 14A is a top view of the semiconductor structure 300 at a fabrication stage. FIGS. 14B, 14C, 14D, 14E, and 14F are sectional views of the semiconductor structure 300 of FIG. 14A, taken along the dashed lines AA', BB', CC', DD' and EE', respectively, in accordance with some embodiments.

The method 200 is described below in conjunction with FIGS. 1 through 14F. Additional steps can be provided before, during, and after the method 200, and some of the steps described can be replaced or eliminated for other embodiments of the method 200.

Figure 3A:
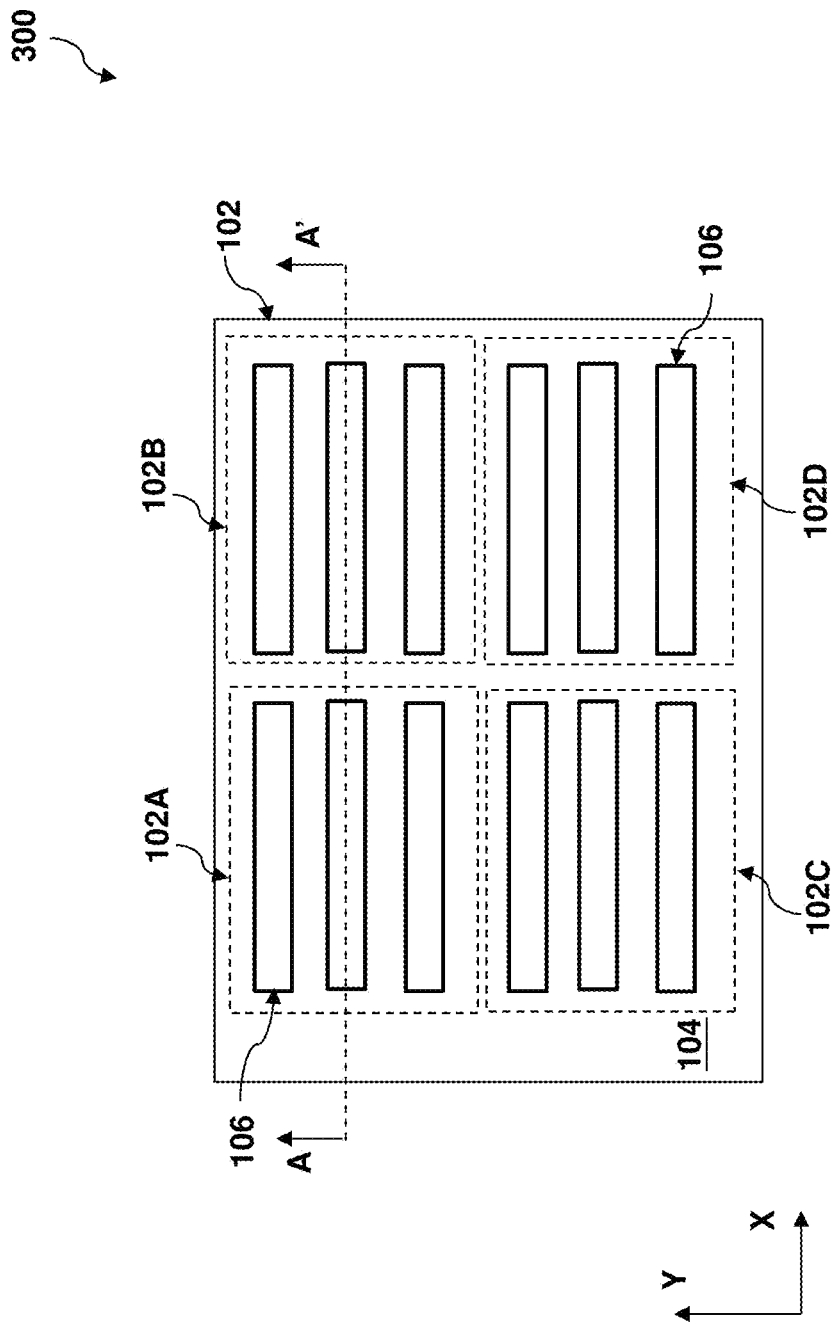
Figure 3B:
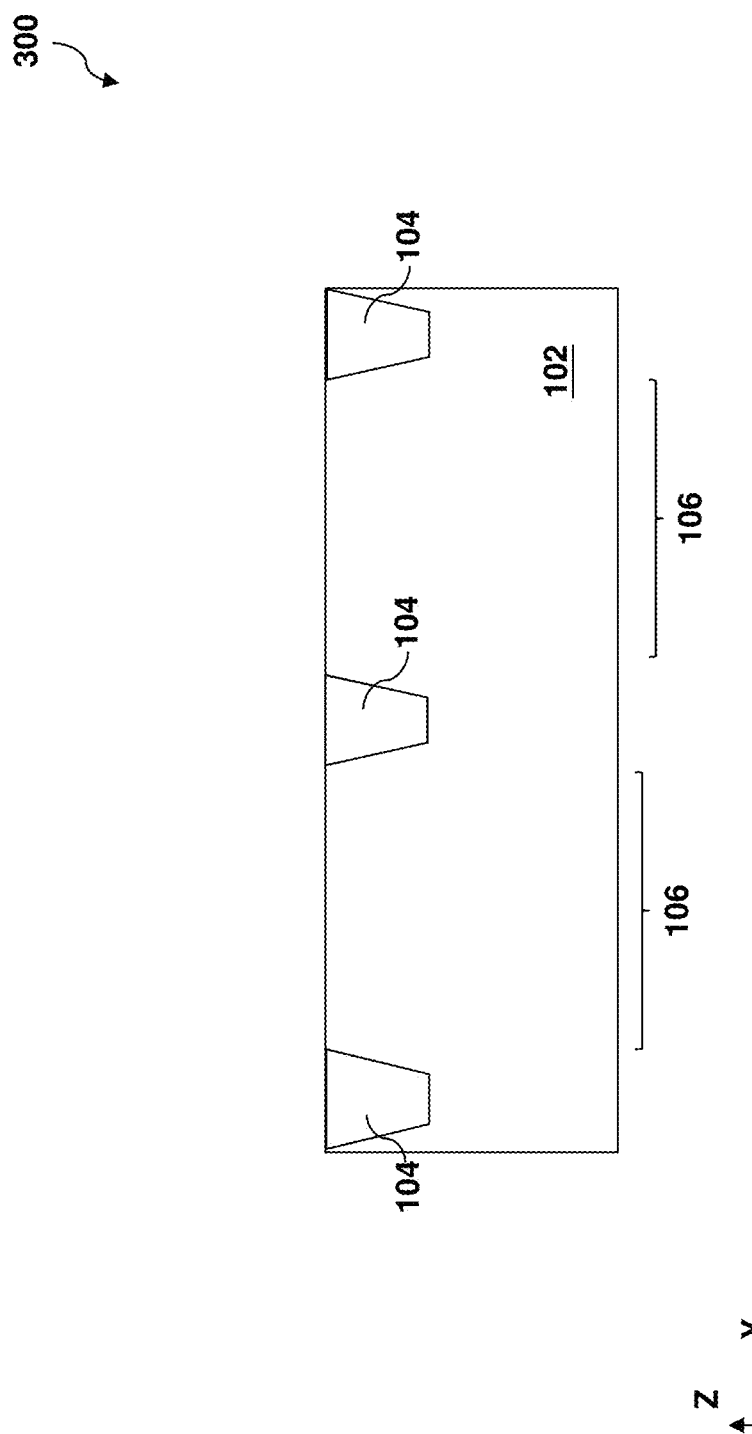
FIGS. 3B, 4B, 5B, 6B, 7B, 8B, 9B, 10B, 11B, 12B, and 13B are sectional views of the workpiece taken along the dashed line AA' at various fabrication stages of the method making the workpiece according to various aspects of the present disclosure.

Referring first to block 202 of FIG. 1 and to FIGS. 3A-3B, the workpiece 300 is received that includes a substrate 102. In various examples, the substrate 102 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride (CaF$_2$); and/or combinations thereof.

The substrate 102 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a silicon oxide, a silicon nitride, a silicon oxynitride, a silicon carbide, and/or other suitable insulator materials.

Still referring to block 204 of FIG. 1 and FIGS. 3A-3B, the method 200 includes an operation to form isolation features 104 in the semiconductor substrate 102, thereby defining a first active regions 106 separated from each other by the isolation feature 104. The formation of the isolation features may include forming a patterned mask by lithography; etching the substrate 102 through the openings of the patterned mask to form trenches; filling the trench with one or more dielectric material; and performing a CMP process. The substrate 102 may include various areas for different devices to be formed thereon. As an example for illustration, the substrate 102 includes four exemplary areas 102A, 102B, 102C and 102D. The first area 102A and the third area 102C are designed for logic devices to be formed thereon. The second area 102B and the fourth area 102D are designed for memory devices, such as static random access memory (SRAM) devices to be formed thereon. Furthermore, in the first area 102A, n-type FETs (nFETs) for the logic devices are formed thereon; in the second area 102B, nFETs for the memory devices are formed thereon; in the third area 102C, p-type FETs (pFETs) for the logic devices are formed thereon; and in the fourth area 102D, pFETs for the memory devices are formed thereon. The following detailed descriptions of the method 200 are directly to the FETs in the first area 102A and second area 102B only for simplicity.

In some embodiments, the active regions are three-dimensional, such as fin active regions. Those FETs formed on those fin active regions are referred to FinFETs accordingly. Referring to block 206 of FIG. 1 and FIGS. 4A and 4B, the method 200 further includes an operation 206 to form fin active regions 108 extruded above the isolation features 104. Those fin active regions also collectively referred to as a fin structure 108. In some embodiments, the fin active regions 108 may be formed by selective etching to recess the isolation features 104. In other embodiments, the fin active regions 108 may be formed by selective epitaxial growth to the active regions with one or more semiconductor material. In yet some embodiments, the fin active regions 108 may be formed by a hybrid procedure having both selective etching to recess and selective epitaxial growth. In yet some embodiments, the operations 204 and 206 may be replaced by a different procedure to form fin active regions 106 and the isolation features 104. For examples, the fin active regions 106 are formed by patterning the substrate 102 and then the isolation features 104 are formed by deposition and CMP.

The fin active regions 108 may have elongated shape oriented along the X direction. The epitaxial grown semiconductor material may include silicon, germanium, silicon germanium, silicon carbide or other suitable semiconductor material. The selective etching process may include wet etching, dry etching, other suitable etching or a combination thereof.

Figure 4A:
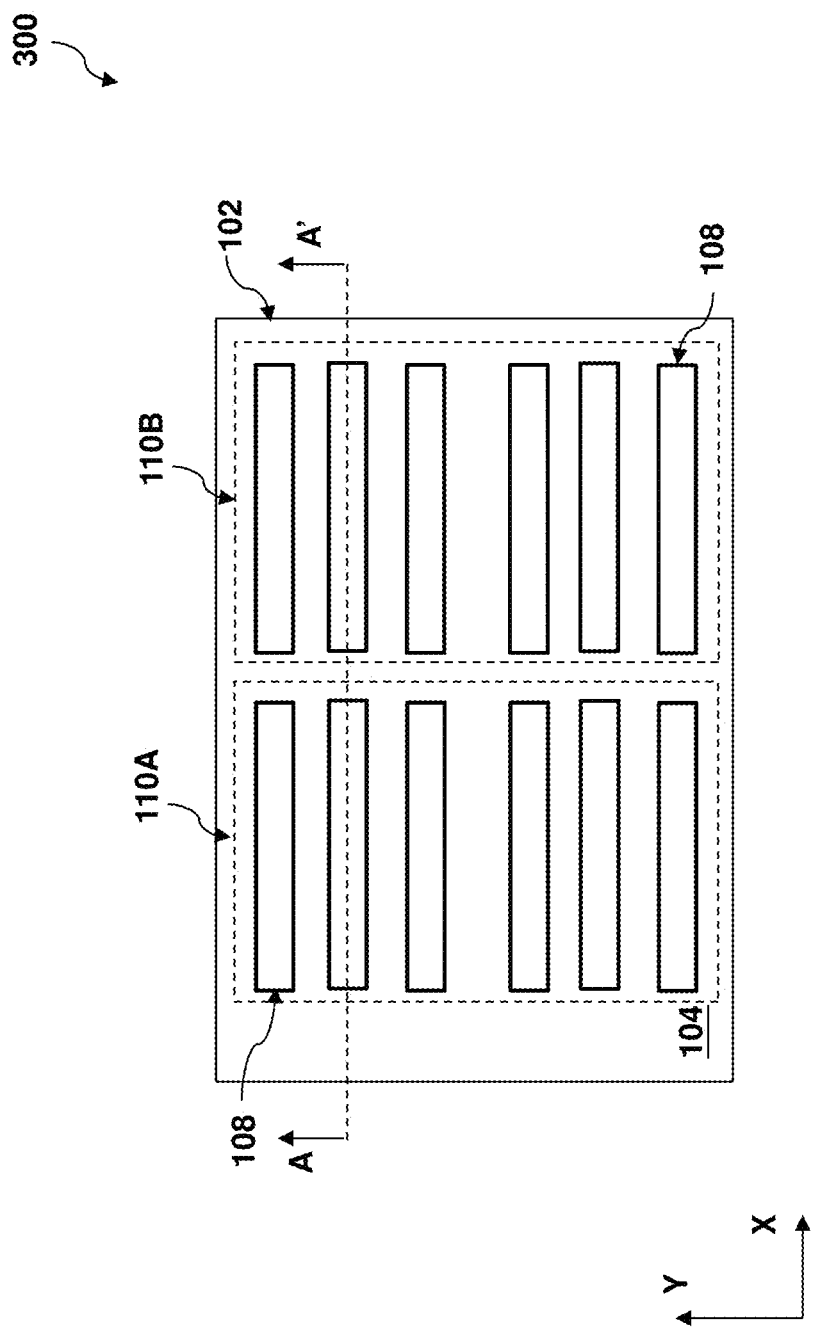
Figure 4B:
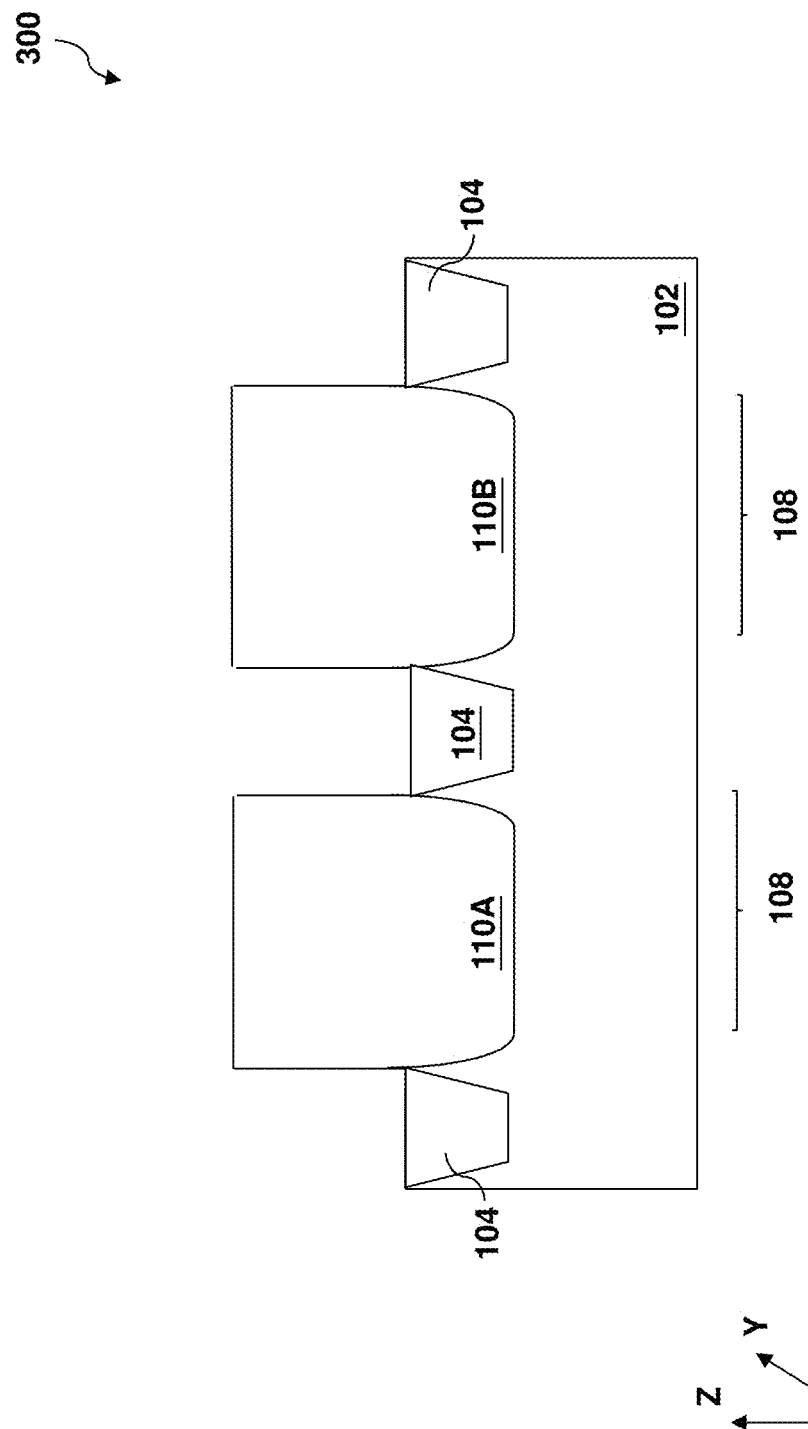
Figure 5A:
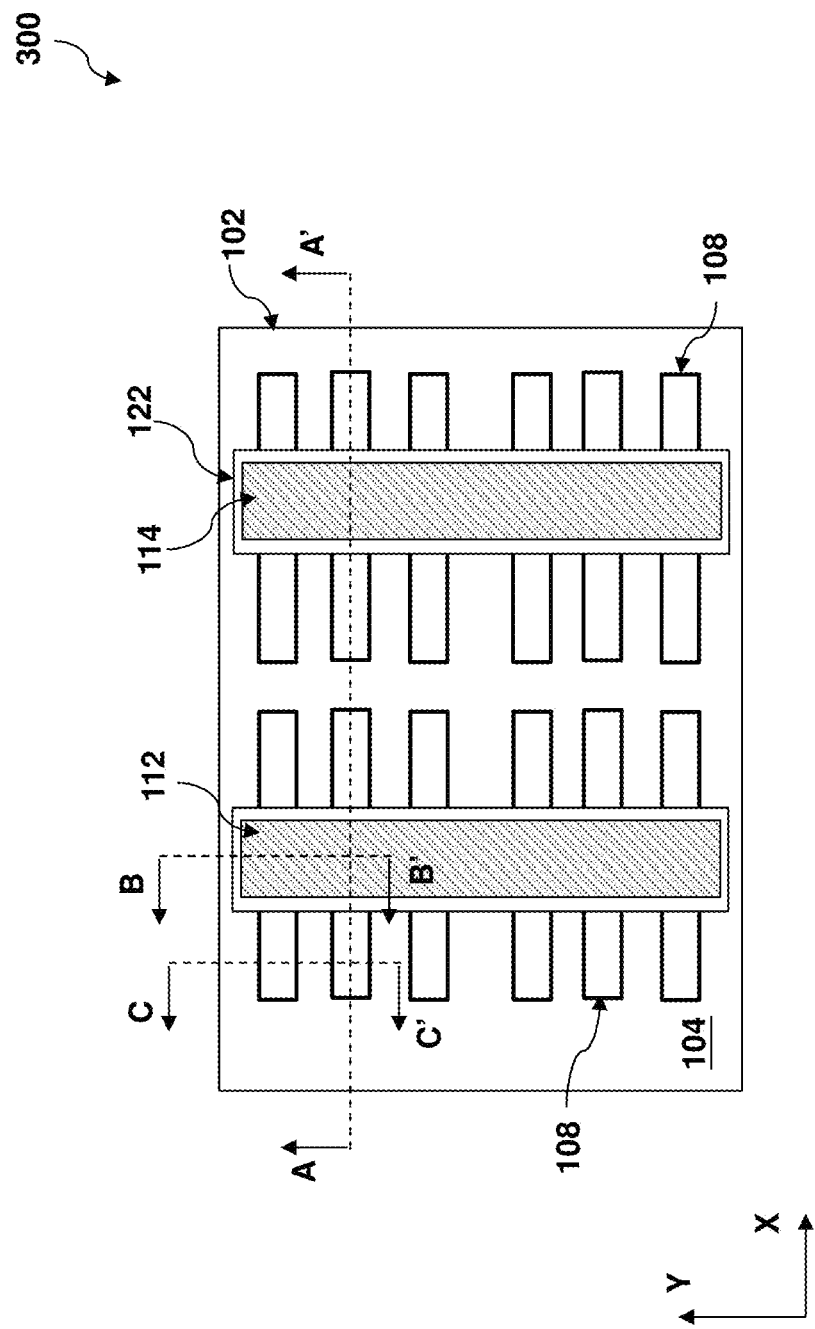
Figure 5B:
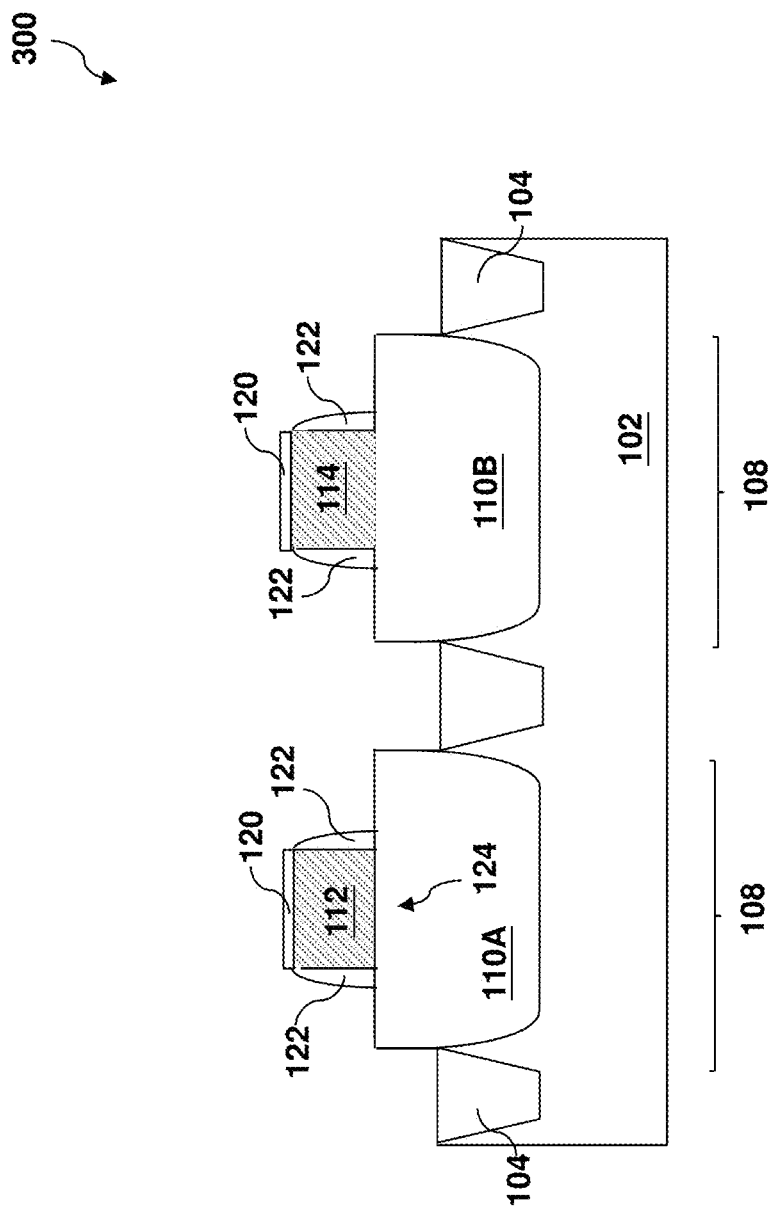
Figure 5C:
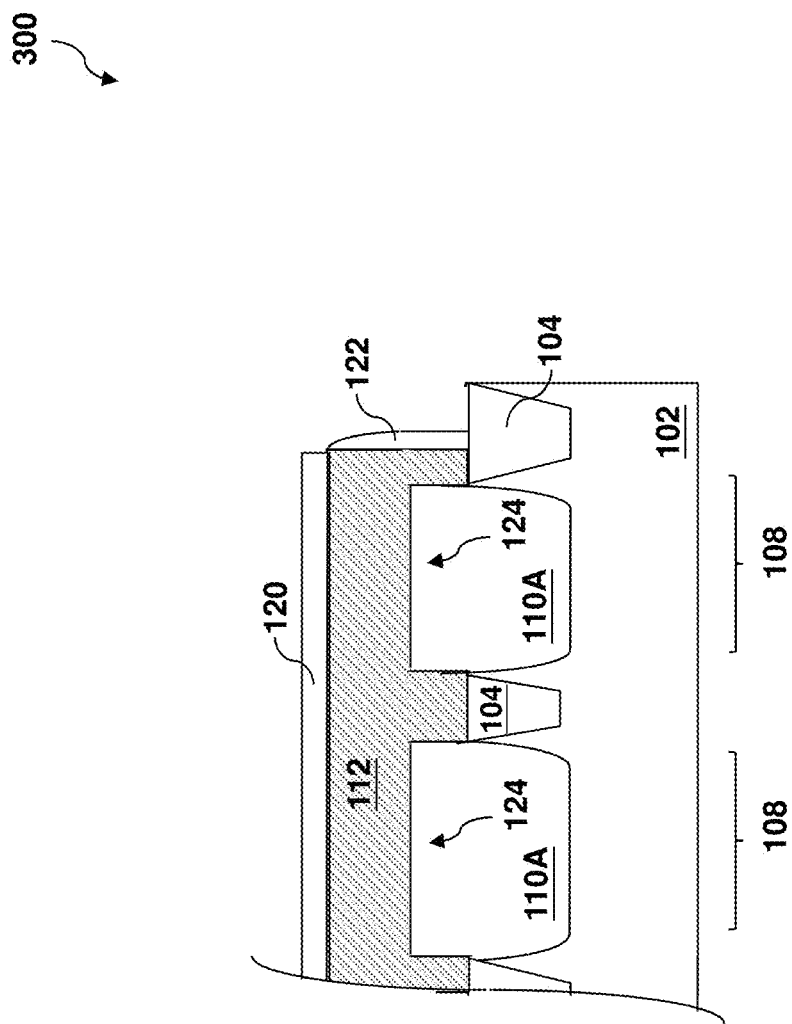
FIGS. 5C, 6C, 7C, 8C, 9C, 10C, 11C, 12C, and 13C are sectional views of the workpiece taken along the dashed line BB' at various fabrication stages of the method making the workpiece according to various aspects of the present disclosure.
Figure 5D:
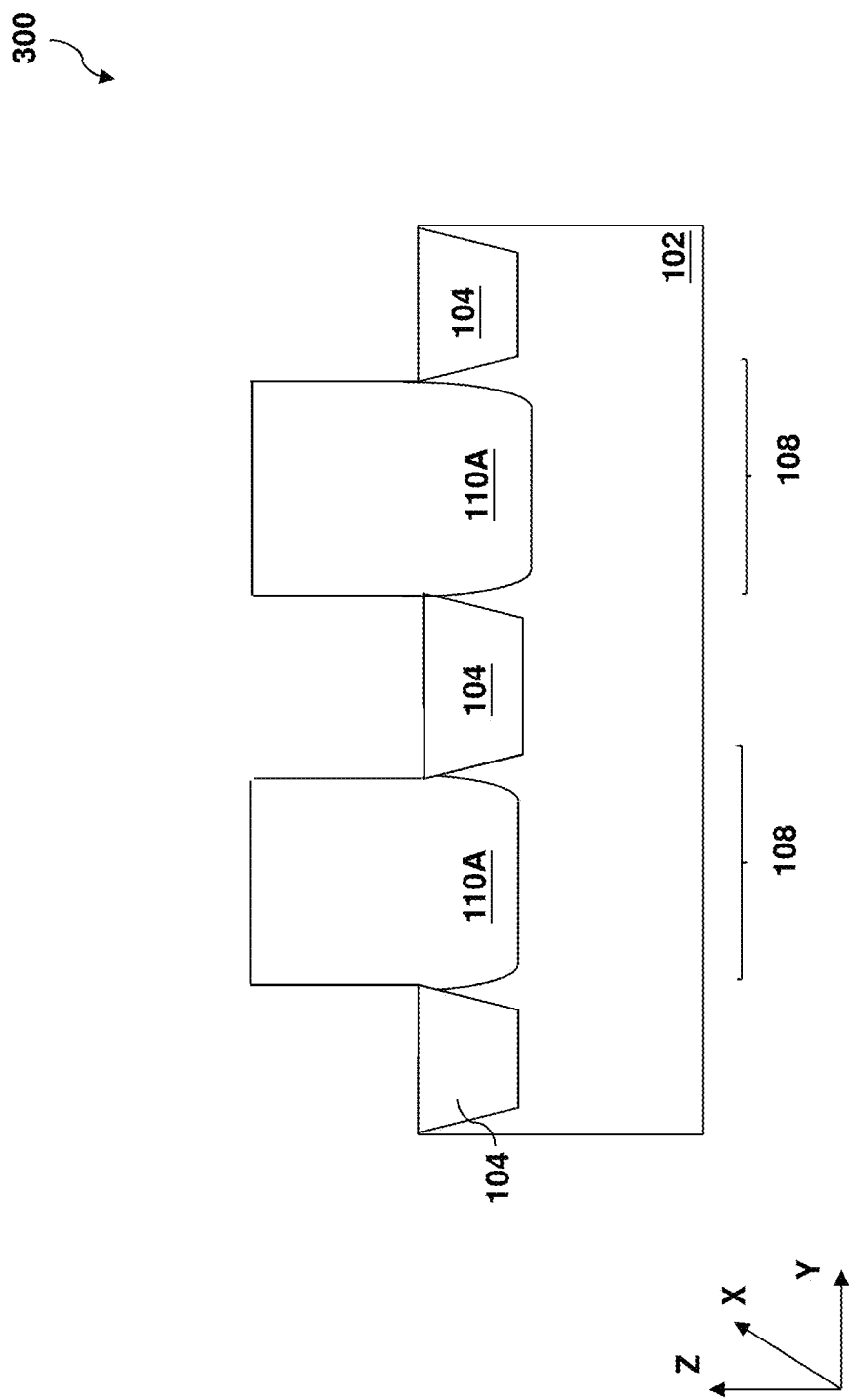
FIGS. 5D, 6D, 7D, 8D, 9D, 10D, 11D, 12D, and 13D are sectional views of the workpiece taken along the dashed line CC' at various fabrication stages of the method making the workpiece according to various aspects of the present disclosure.
Figure 6A:
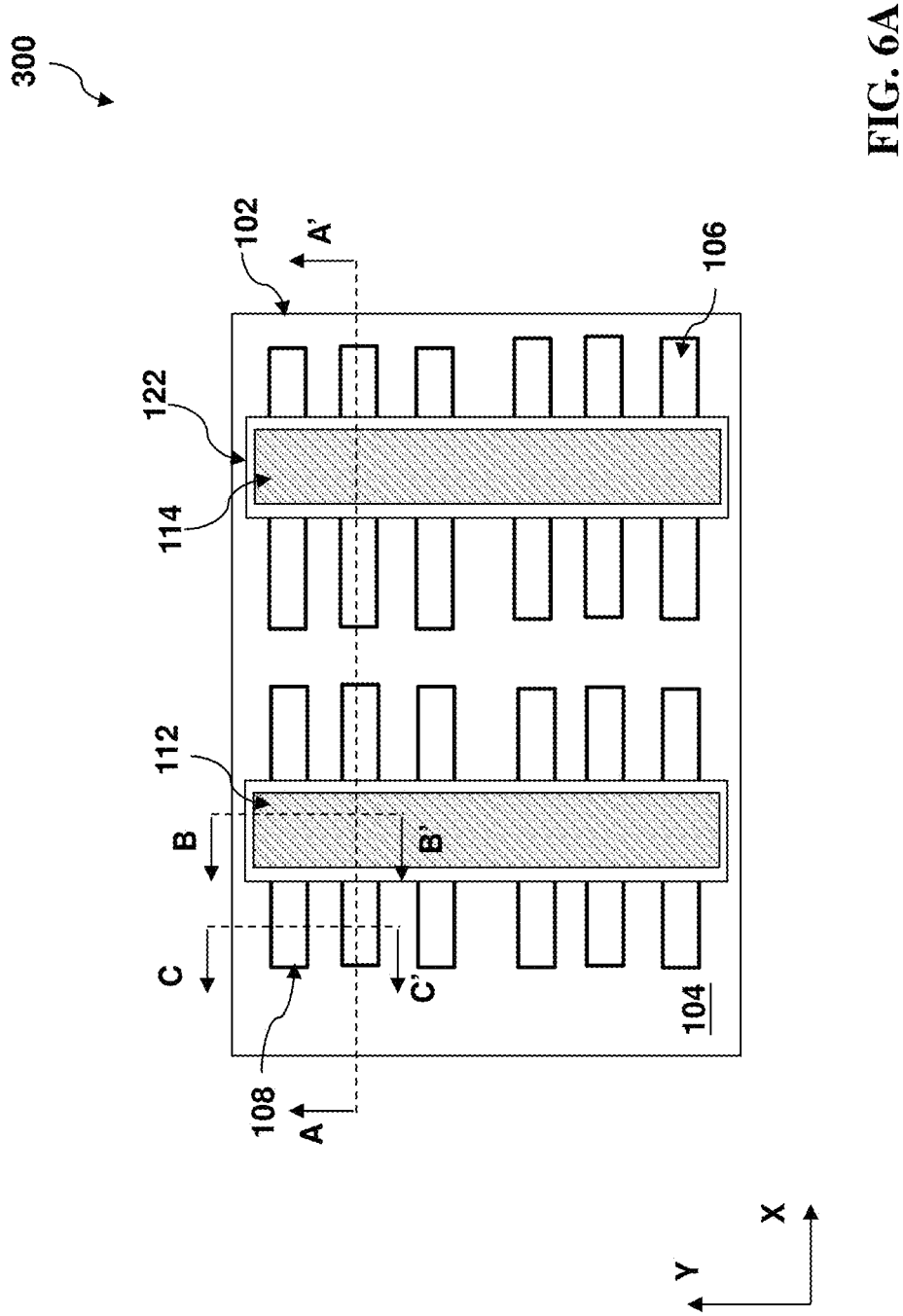
Figure 6B:
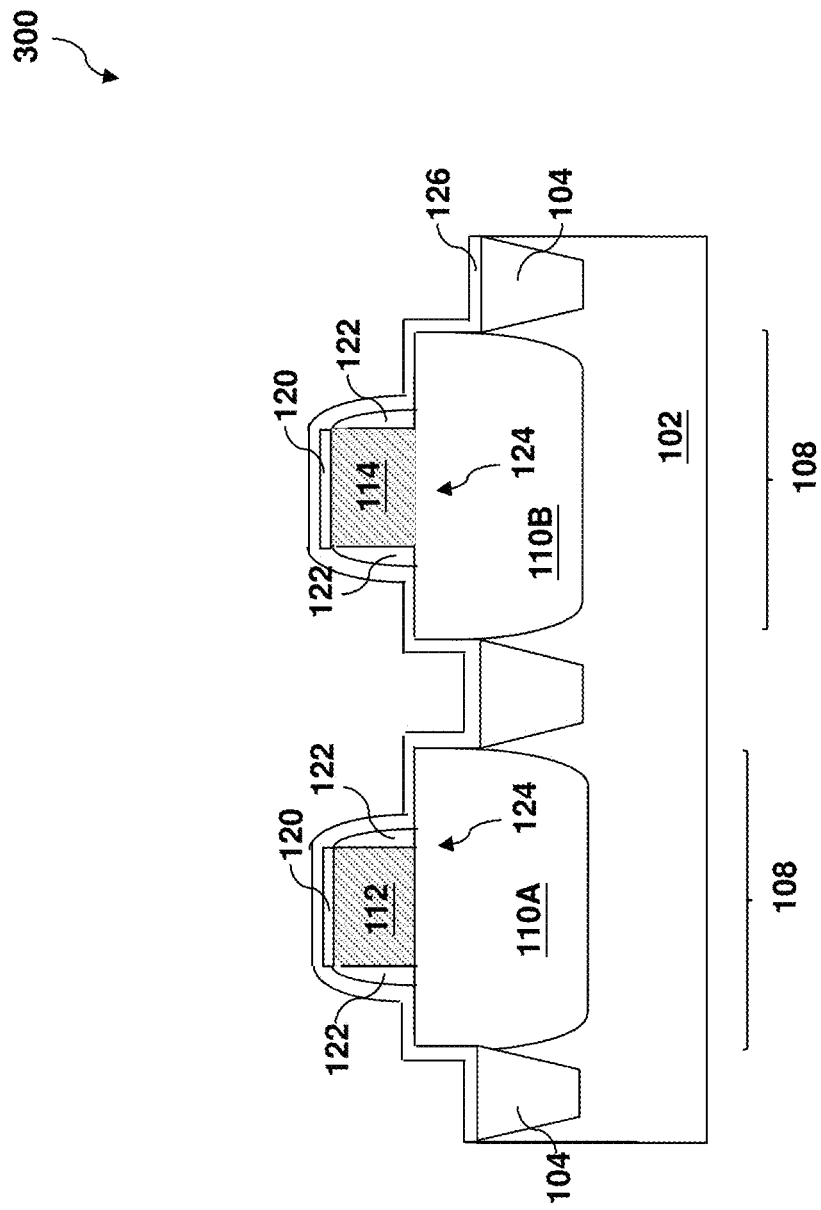
Figure 6C:
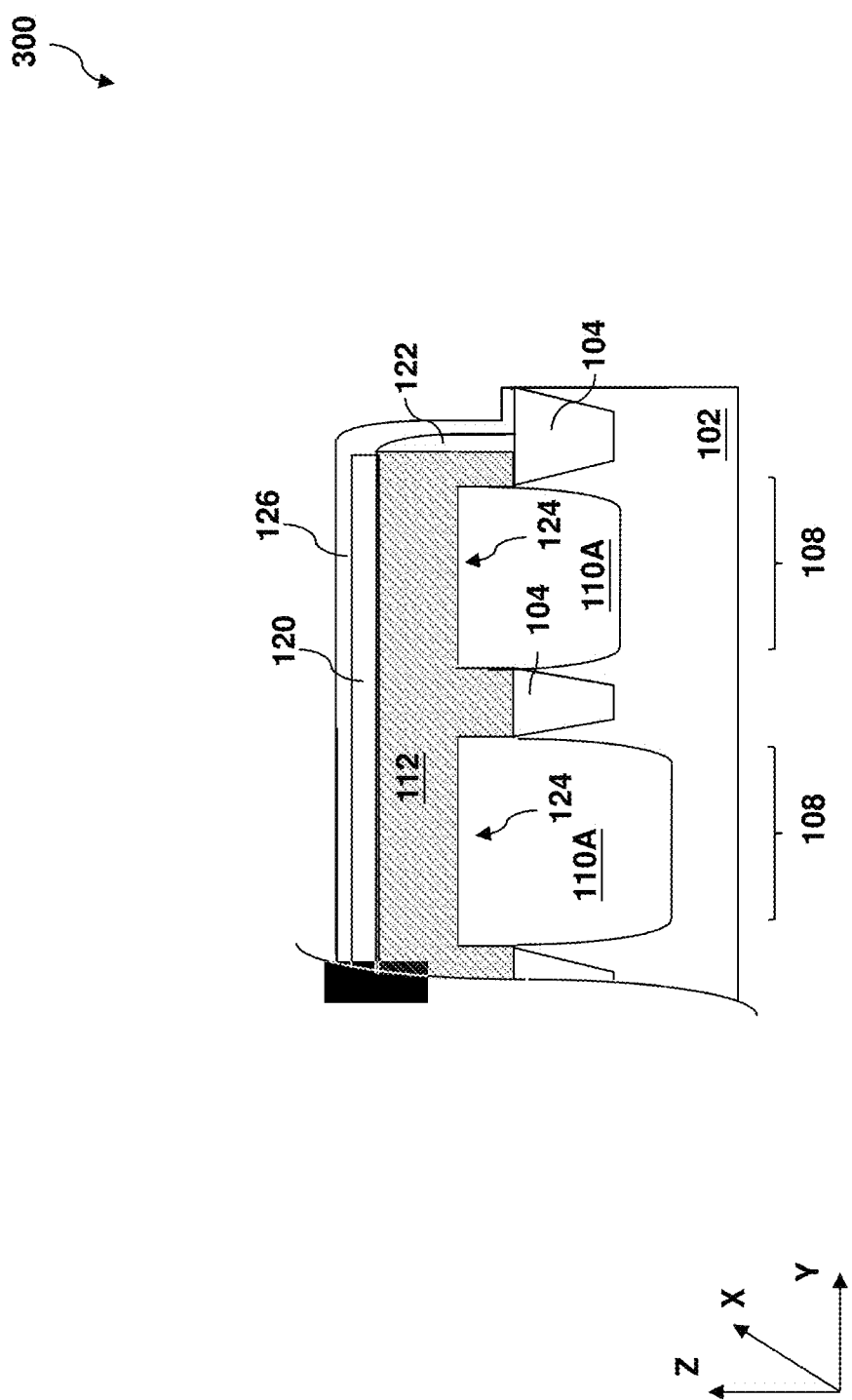
Figure 6D:
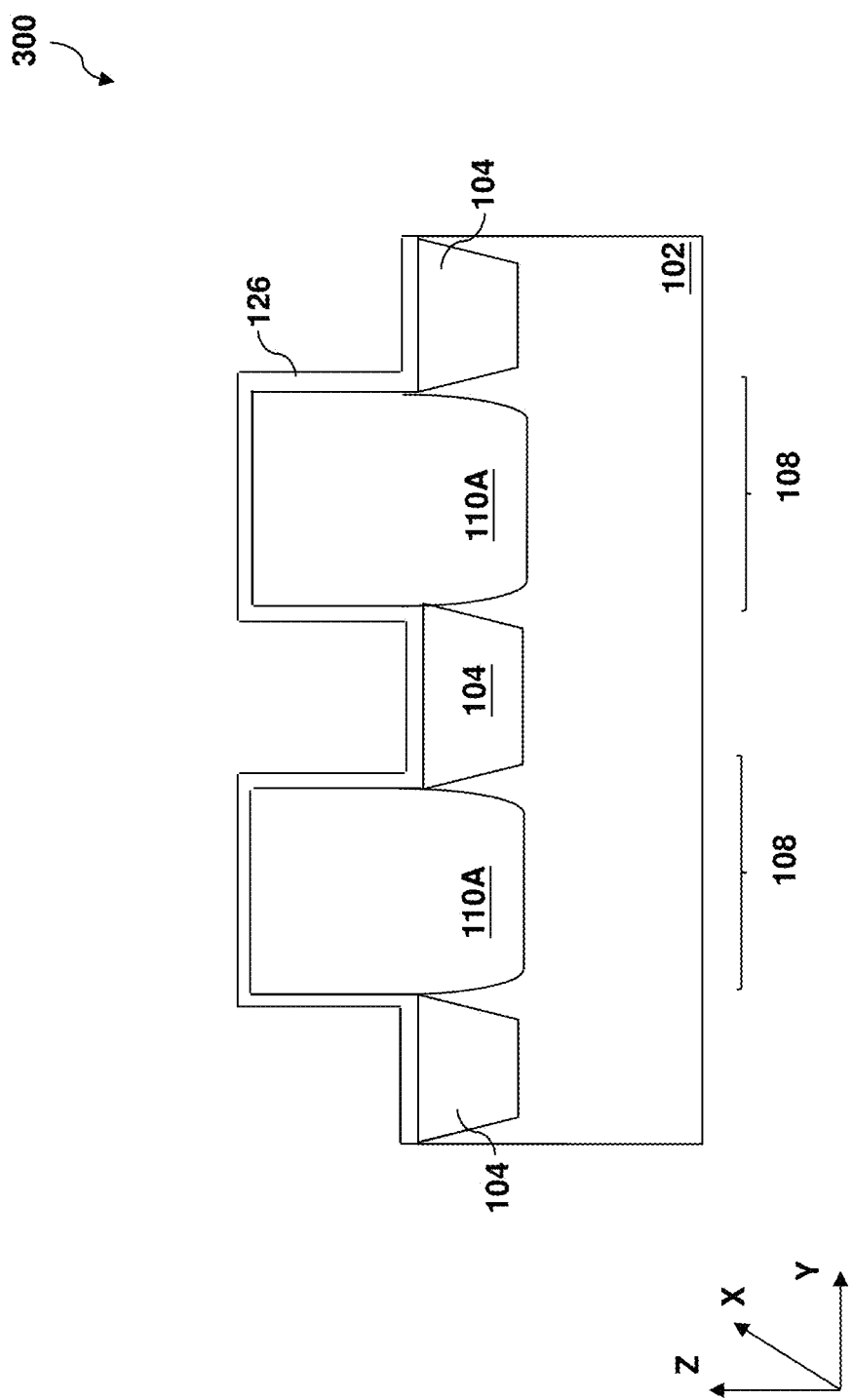

Still referring to block 208 of FIG. 1 and FIGS. 4A and 4B, the method 200 may further include an operation 208 to form one or more doped well (such as 110A and 110B) on the fin active region 108. The doped well extends through the fin active region 108 along the X direction, such as from the left isolation feature 104 to the right isolation feature 104 so that a fin active region 108 is enclosed within the corresponding doped well. The doped well is formed by ion implantation or other suitable technique. In some examples, the doped well is n-type doped for one or more p-type field effect transistor (FET) to be formed thereon. In some examples, the doped well is p-type doped for one or more n-type FET to be formed thereon. In some examples, the semiconductor structure 300 includes a p-type doped well 110A and an n-type doped well 110B as illustrated in FIG. 4B.

Referring to block 210 of FIG. 1 and FIGS. 5A-5D, the method 200 includes an operation to form one or more gate stack, such as 112 and 114 on the substrate 102. In the present embodiment, the gate stacks are dummy gate stacks and will be replaced by metal gate stacks at later stages. Each gate stack may include a gate dielectric layer (such as silicon oxide) and a gate electrode (such as polysilicon) on the gate dielectric layer on the fin active regions 108. The formation of the gate stacks includes forming various gate material layers (such as thermal oxidation to form silicon oxide and depositing polysilicon), and patterning the gate material layers using lithography process and etching. A hard mask 120 may be used to pattern the gate material layers. For example, the hard mask 120 is deposited on the gate material layers, and is patterned by lithography process and etching to have various openings. Then the pattern defined on the hard mask is transferred to the gate material layers by etching. In some examples, the hard mask 120 includes silicon nitride, silicon oxide, other suitable material, or a combination thereof. In some examples, the hard mask 120 may include multiple films, such as a silicon nitride layer and a silicon oxide layer on the silicon nitride layer.

To pattern the hard mask 120, the operation 210 may include a variety of processes such as photolithography and etching. The photolithography process may include forming a photoresist (not shown) over the substrate 102. An exemplary photoresist includes a photosensitive material sensitive to radiation such as UV light, deep ultraviolet (DUV) radiation, and/or EUV radiation. A lithographic exposure is performed on the workpiece 300 that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers may include TMAH (tetramethyl ammonium hydroxide), KOH, and NaOH, and suitable negative developers may include solvents such as n-butyl acetate, ethanol, hexane, benzene, and toluene. After the photoresist is developed, the exposed portions of the hard mask 120 may be removed by an etching process, such as wet etching, dry etching, Reactive Ion Etching (RIE), ashing, and/or other etching methods, resulting in a patterned hard mask 210. After etching, the photoresist may be removed by wet stripping or plasma ashing.

In some embodiments, gate spacer 122 may be formed on sidewalls of the gate stacks. The gate spacer 122 includes one or more dielectric material, such as silicon oxide, silicon nitride, silicon oxynitride, other suitable dielectric material or a combination thereof. The spacer 122 may have a multilayer structure and may be formed by depositing dielectric material and then anisotropic etching, such as plasma etching. In some embodiments, gate spacers 122 may be used to offset the subsequently formed source/drain features and may be used for designing or modifying the source/drain profile.

The dummy gate stacks is formed over channel regions 124 over the fins 108, wherein the channel regions 124 may be portions of the corresponding FETs. The formation of the metal gate stacks may include a gate-last process, a high-k-last process, or other suitable procedure, which will be described at later stage.

Referring to block 212 of FIG. 1 and to FIGS. 6A-6D, the method 200 proceeds to an operation to form a dielectric layer 126 on the workpiece 300. The dielectric layer 126 may be deposited by suitable method, such as CVD or other proper technique. The dielectric layer 126 may provide proper functions, such as etching stop/protection, during the fabrication process. The dielectric layer 126 may include multiple films. In the present embodiment, the dielectric layer 126 includes a silicon oxynitride film, a silicon nitride film on the silicon oxynitride film, and a low-k dielectric film on the silicon nitride film. Each film may be deposited by CVD with proper thicknesses.

The method 200 proceeds to a block 214 to form epitaxial source and drain features. The operation 214 is further described in details with reference to FIG. 2.

Figure 7A:
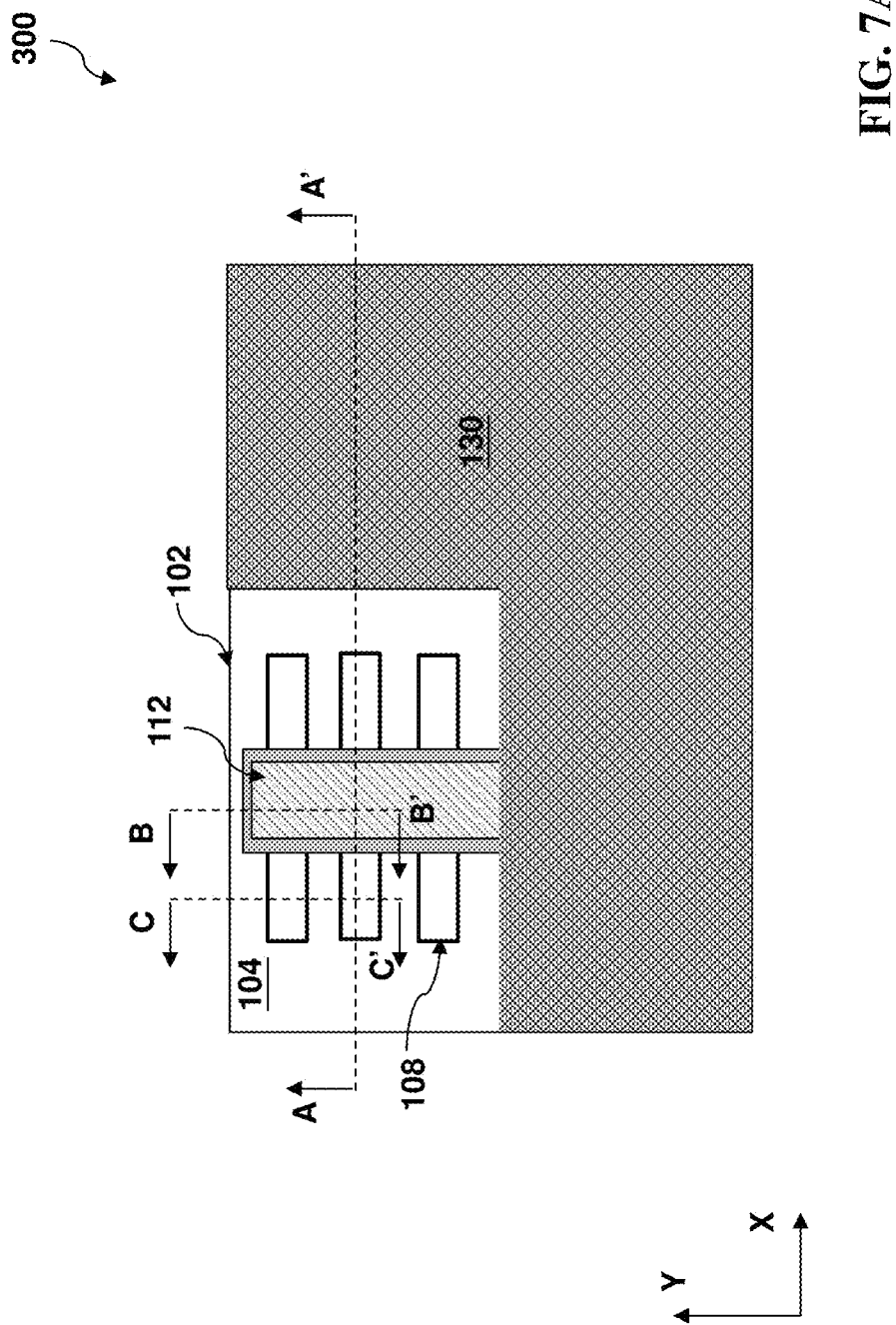
Figure 7B:
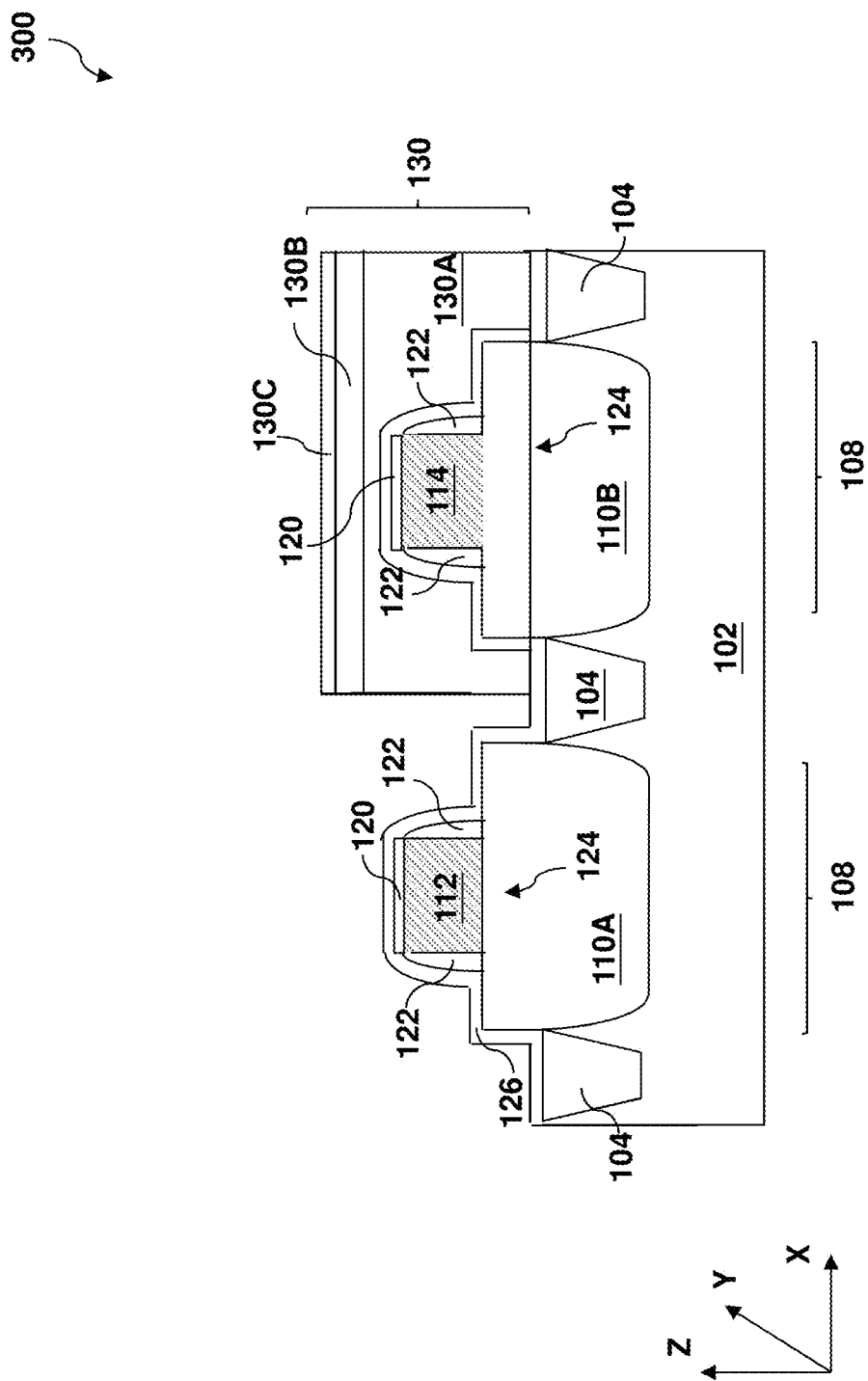
Figure 7C:
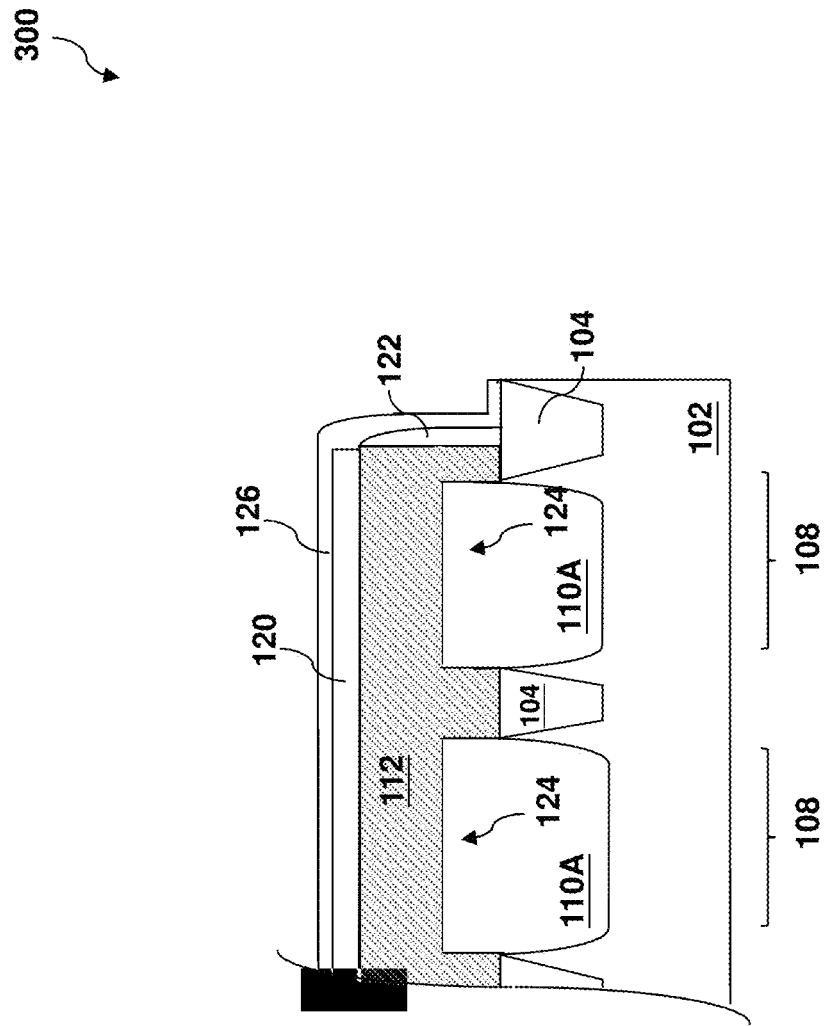
Figure 7D:
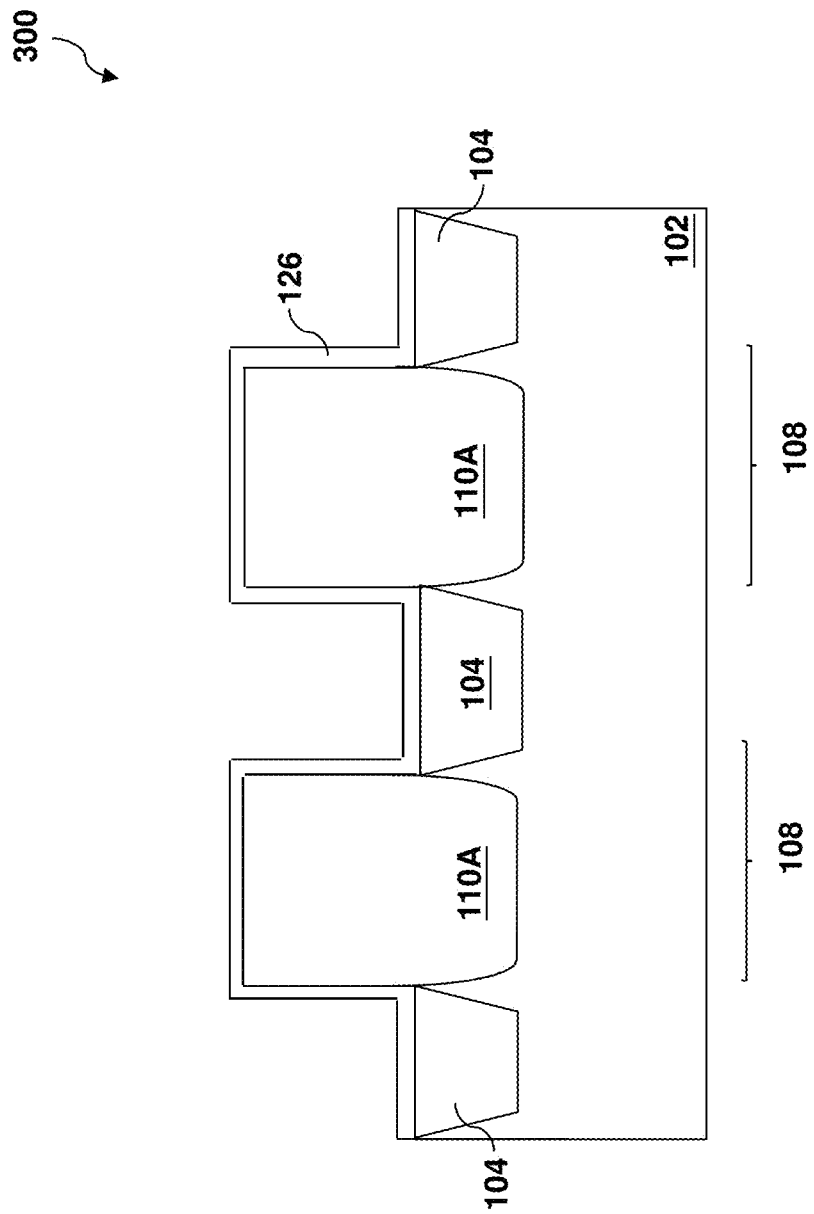
Figure 8A:
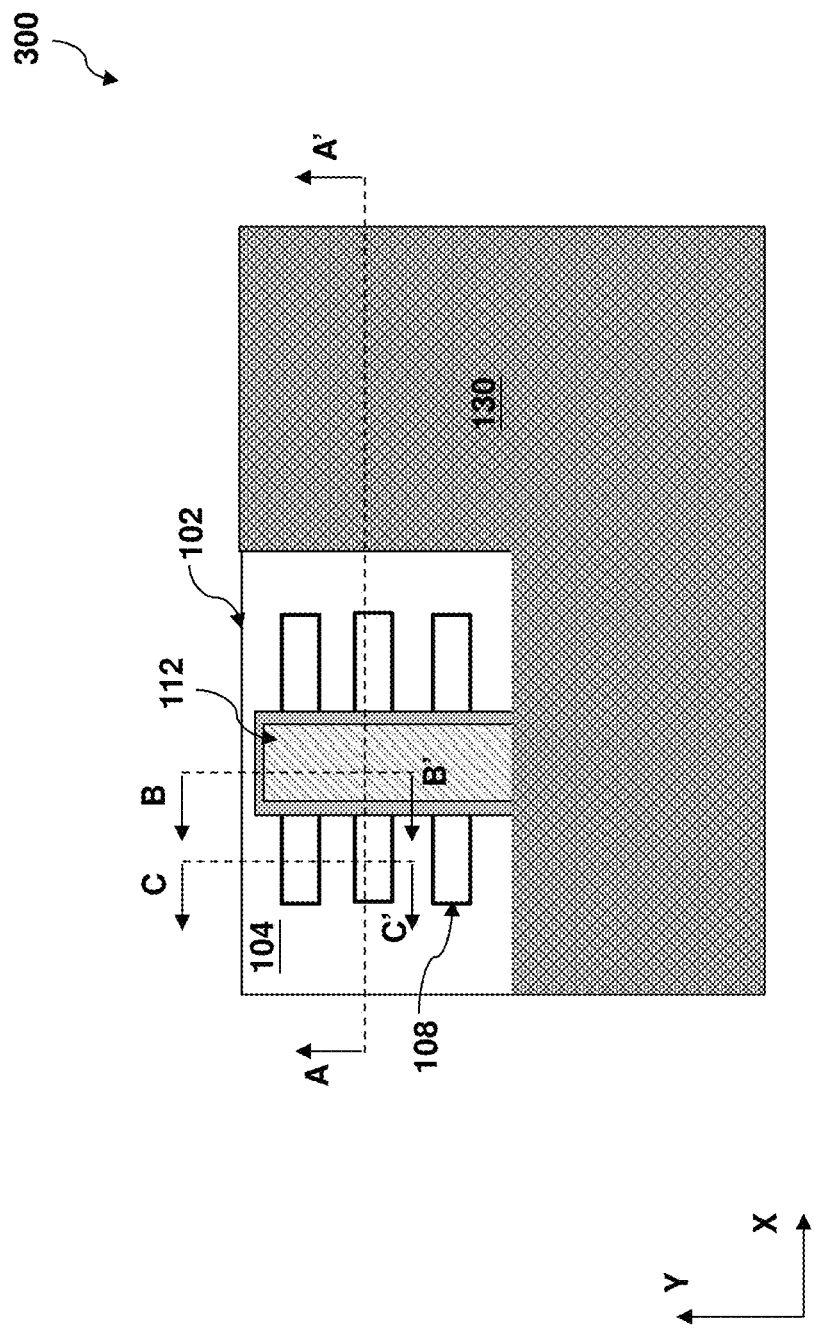
Figure 8B:
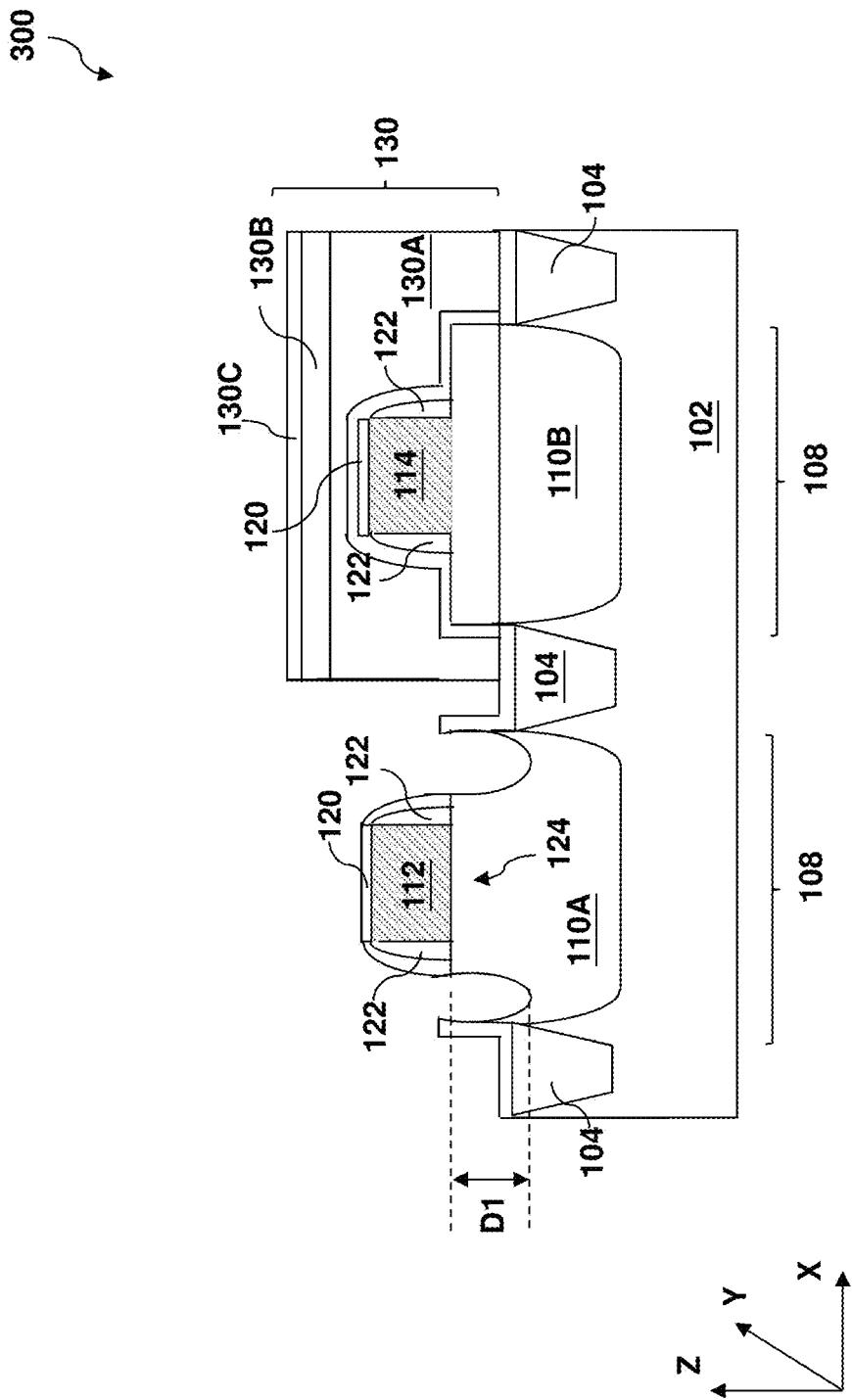
Figure 8C:
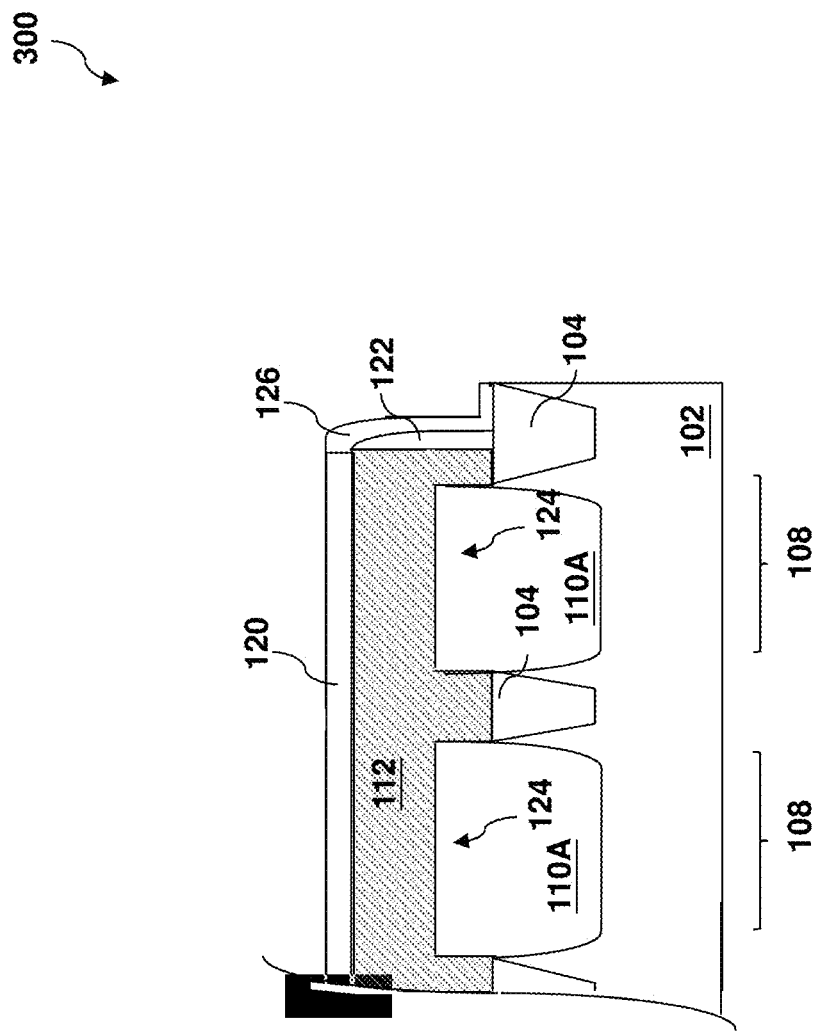
Figure 8D:
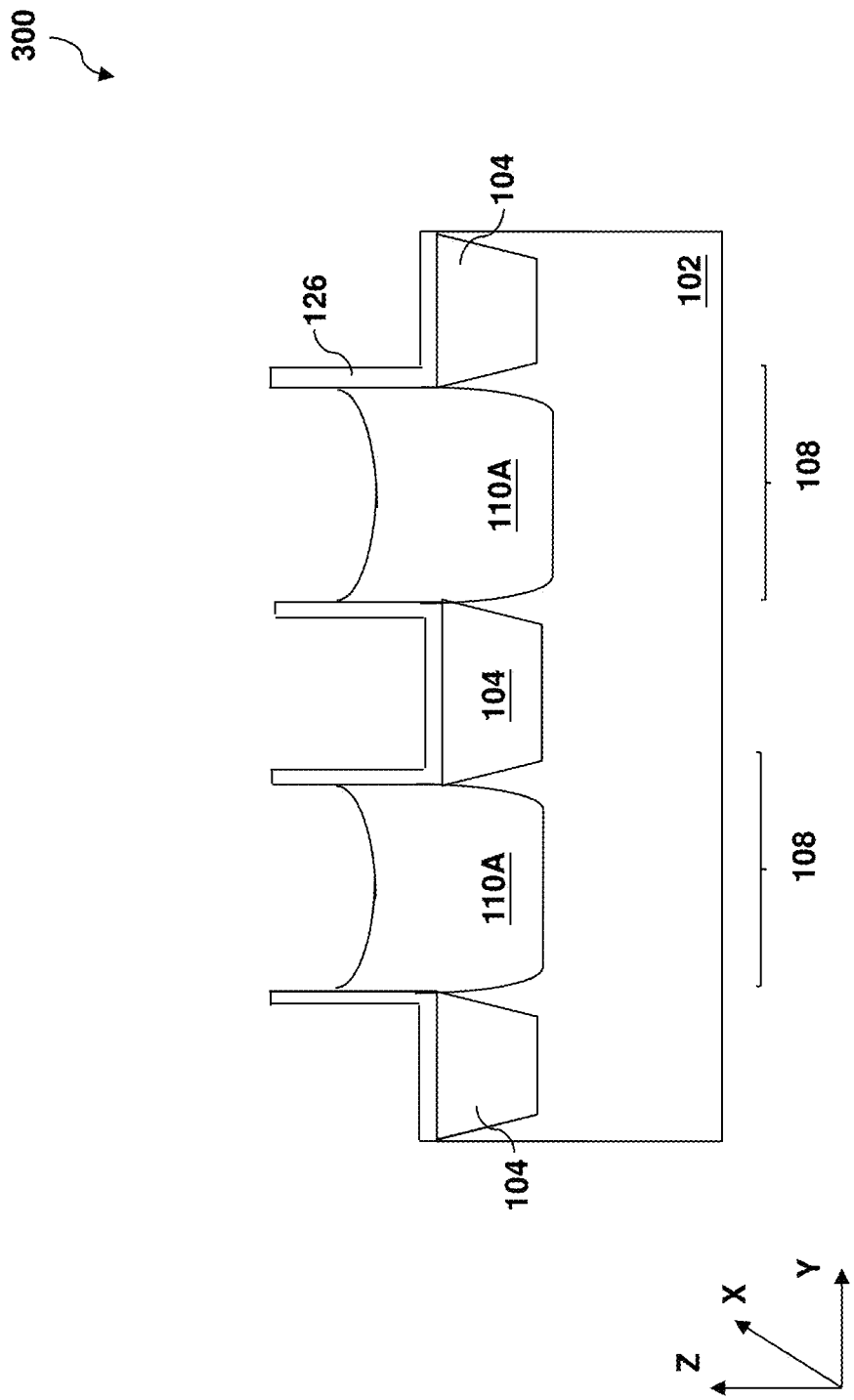
Figure 9B:
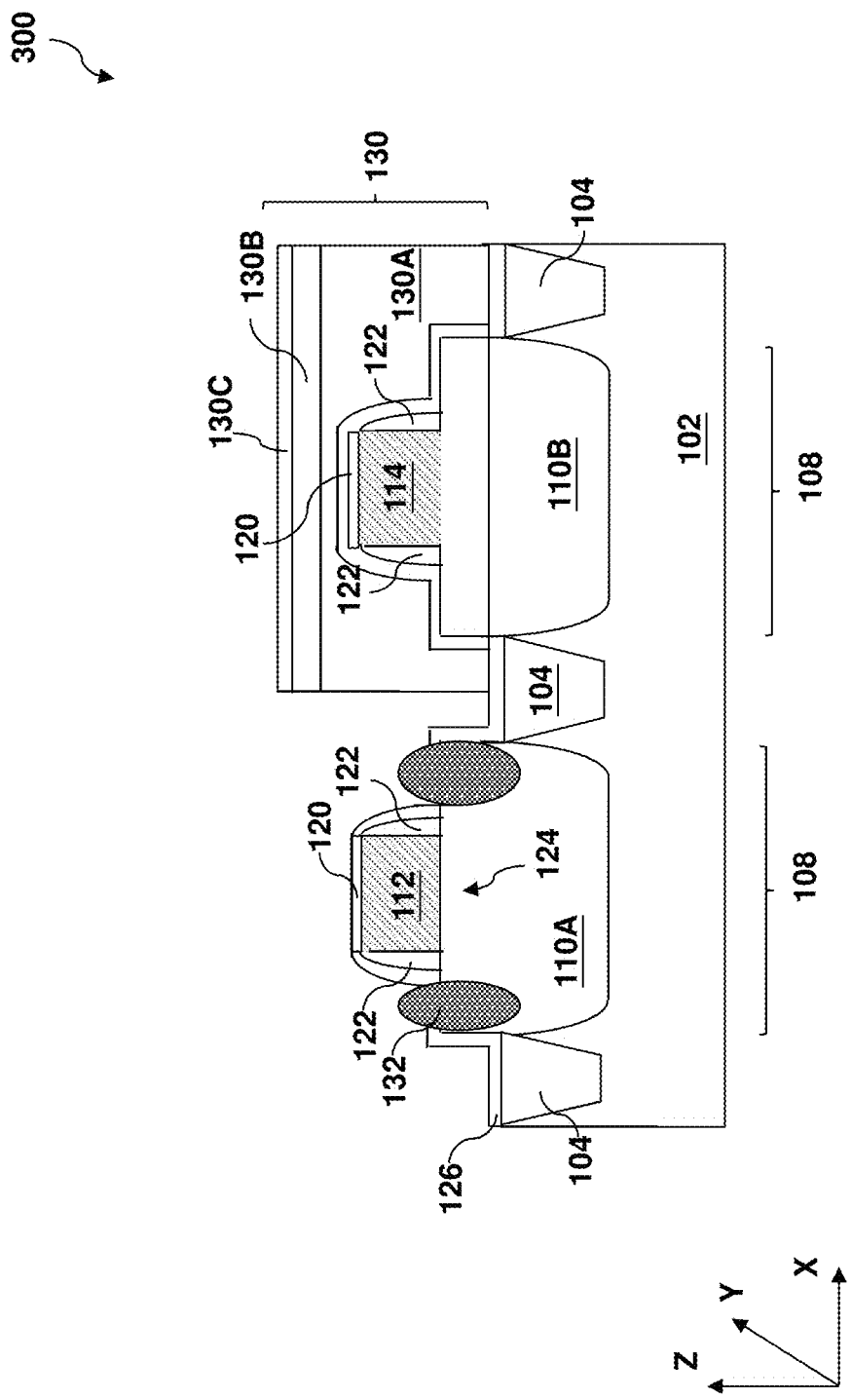
Figure 9C:
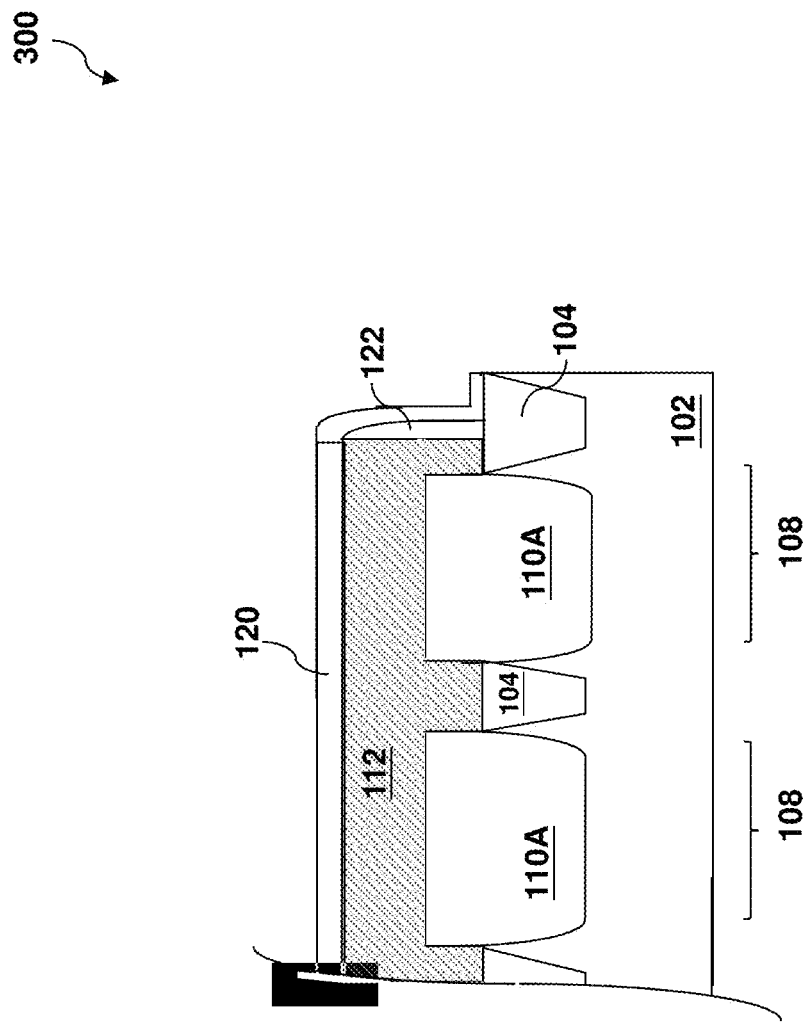
Figure 9D:
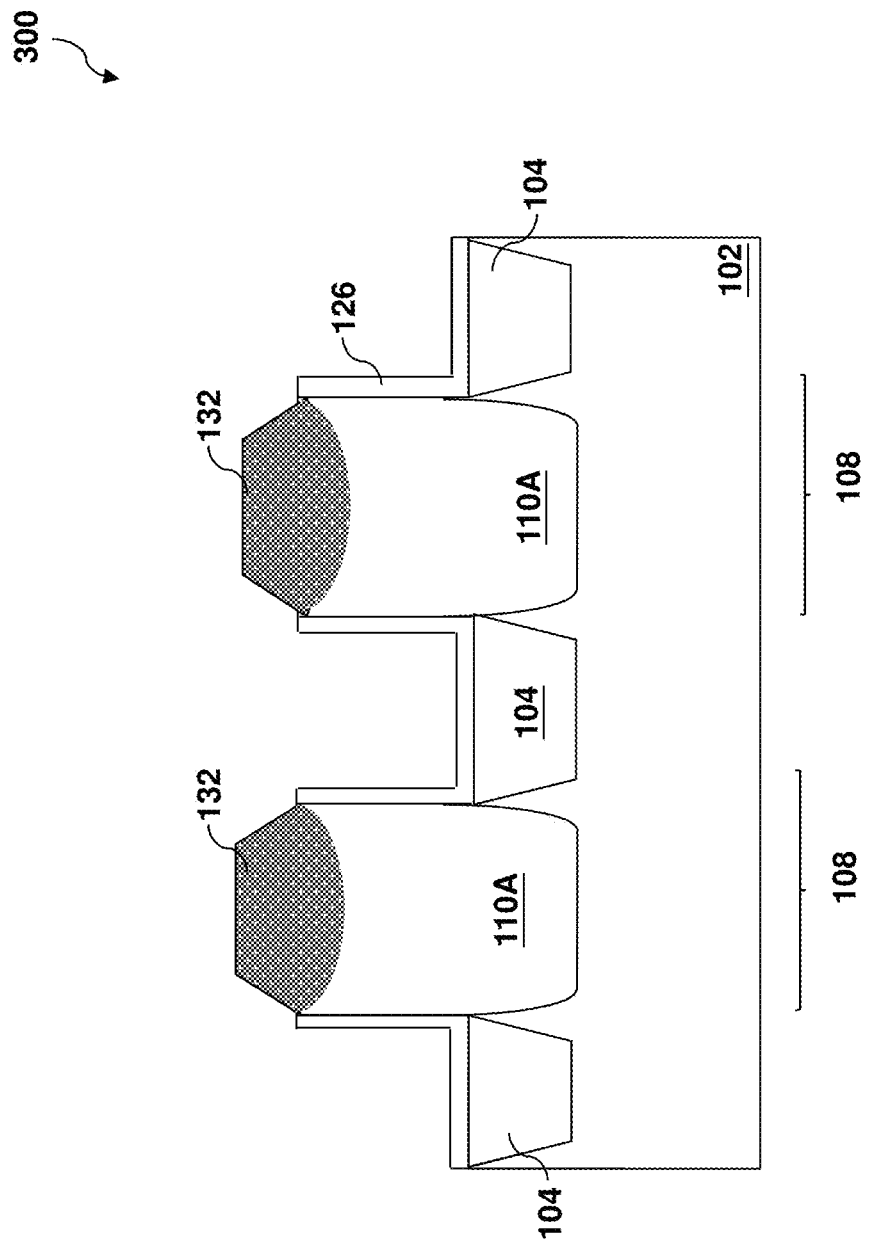

Referring to block 222 of FIG. 2 and to FIGS. 7A-7D, the method 200 proceeds to an operation to form a patterned photoresist layer 130 with an opening to expose first source/drain regions within a first area of the workpiece 300. A source/drain region refers to an area of a fin active region for the corresponding source/drain feature to be formed thereon. In some embodiment, the first area includes various devices to be formed, such as logic devices. The patterned photoresist layer 130 is formed by lithography process with an opening defining the first area, as illustrated in FIG. 7A. In the present embodiment, the photoresist layer 130 is a tri-layer photoresist that includes a bottom layer 130A, a middle layer 130B and photosensitive layer 130C to enhance lithography process with high resolution and etch resistance, as illustrated in FIG. 7B.

Referring to block 224 of FIG. 2 and to FIGS. 8A-8D, the method 200 proceeds to an operation to perform a dry etching process to first source/drain regions within the first area of the workpiece 300. The dry etching process may include one or more etching step that opens the dielectric layer 126 and recesses the source/drain regions in the first area. Especially, the dry etching process recesses the first source/drain regions to form trenches with a first depth $D_1$, such as in a range from 55 nm to 65 nm. In some examples, the dry etching process includes applying an etchant containing carbon oxide and hydrofluoric carbide.

Referring to block 226 of FIG. 2 and to FIGS. 9A-9D, an epitaxial process is performed to form first source/drain features 132 on the substrate 102 in the first area. During the epitaxial process, the dummy gate stacks and/or the patterned photoresist layer 130 limit the source/drain features 132 to the source/drain regions in the first area. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which interact with the composition of the substrate 102. The source/drain features 132 may be in-situ doped during the epitaxial process by introducing doping species including: p-type dopants, such as boron or $BF_2$; n-type dopants, such as phosphorus or arsenic; and/or other suitable dopants including combinations thereof. If the source/drain features 132 are not in-situ doped, an implantation process (i.e., a junction implant process) is performed to dope the source/drain features 132. In an exemplary embodiment, the source/drain features 132 in an NMOS device include SiP, while those in a PMOS device include GeSnB (tin may be used to tune the lattice constant) and/or SiGeSnB. One or more annealing processes may be performed to activate the source/drain features 132. Suitable annealing processes include rapid thermal annealing (RTA) and/or laser annealing processes. After the formation of the first source/drain features 132, the patterned photoresist layer 130 is removed by proper techniques.

Figure 10A:
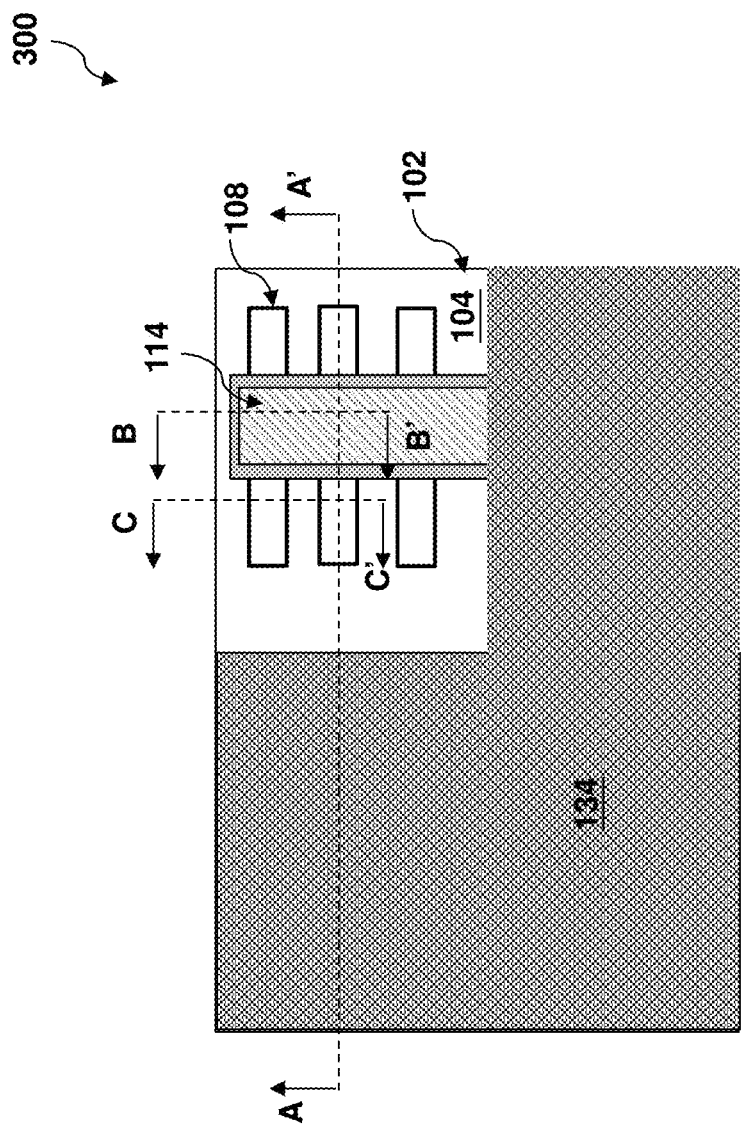
Figure 10B:
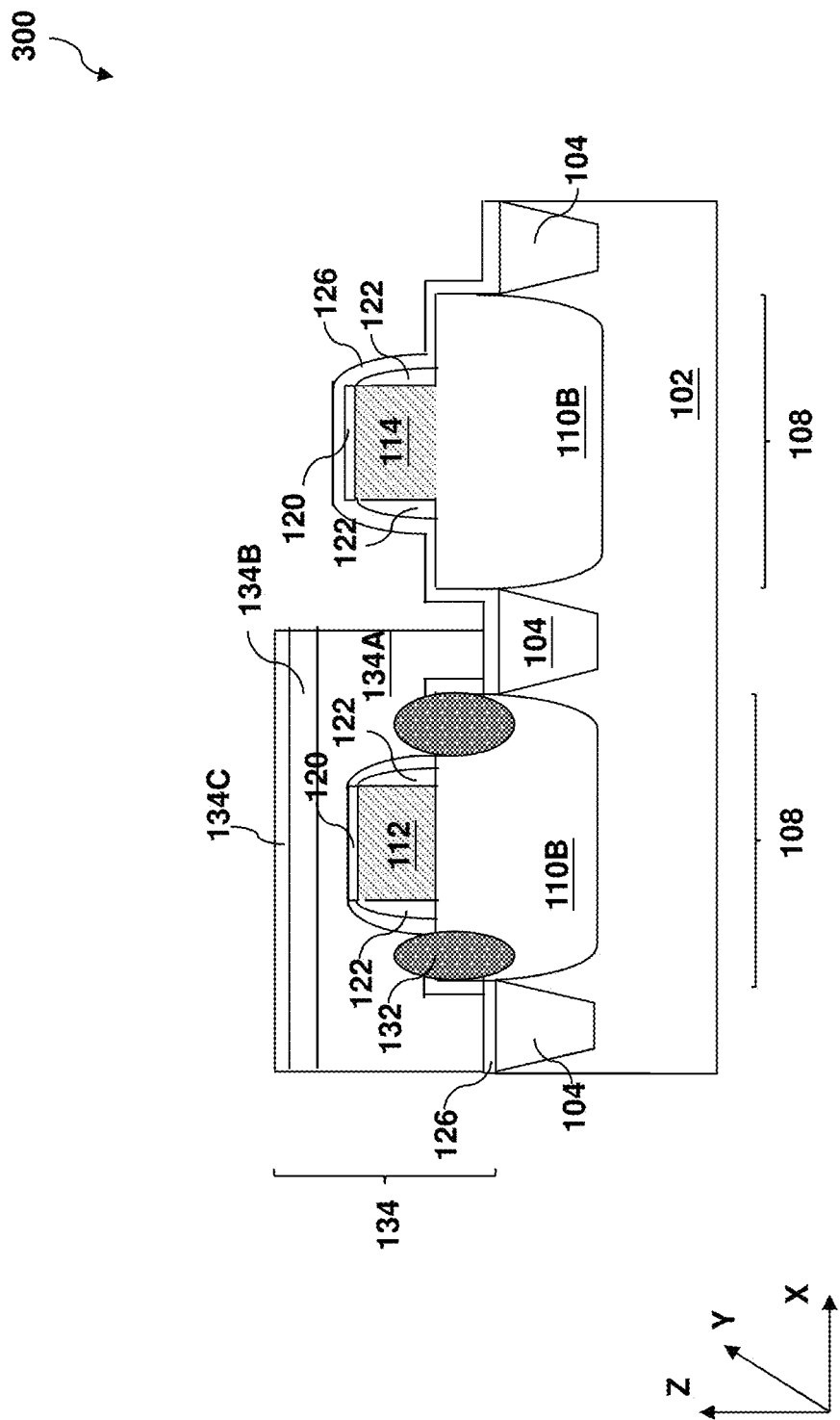
Figure 10C:
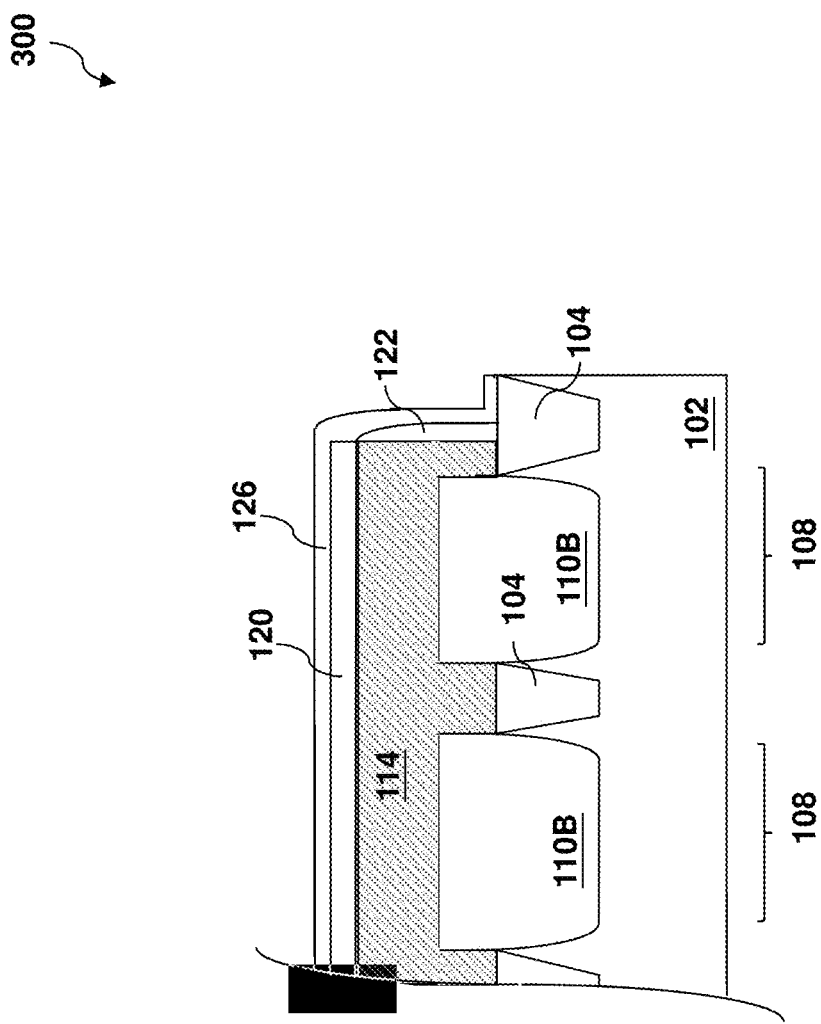
Figure 10D:
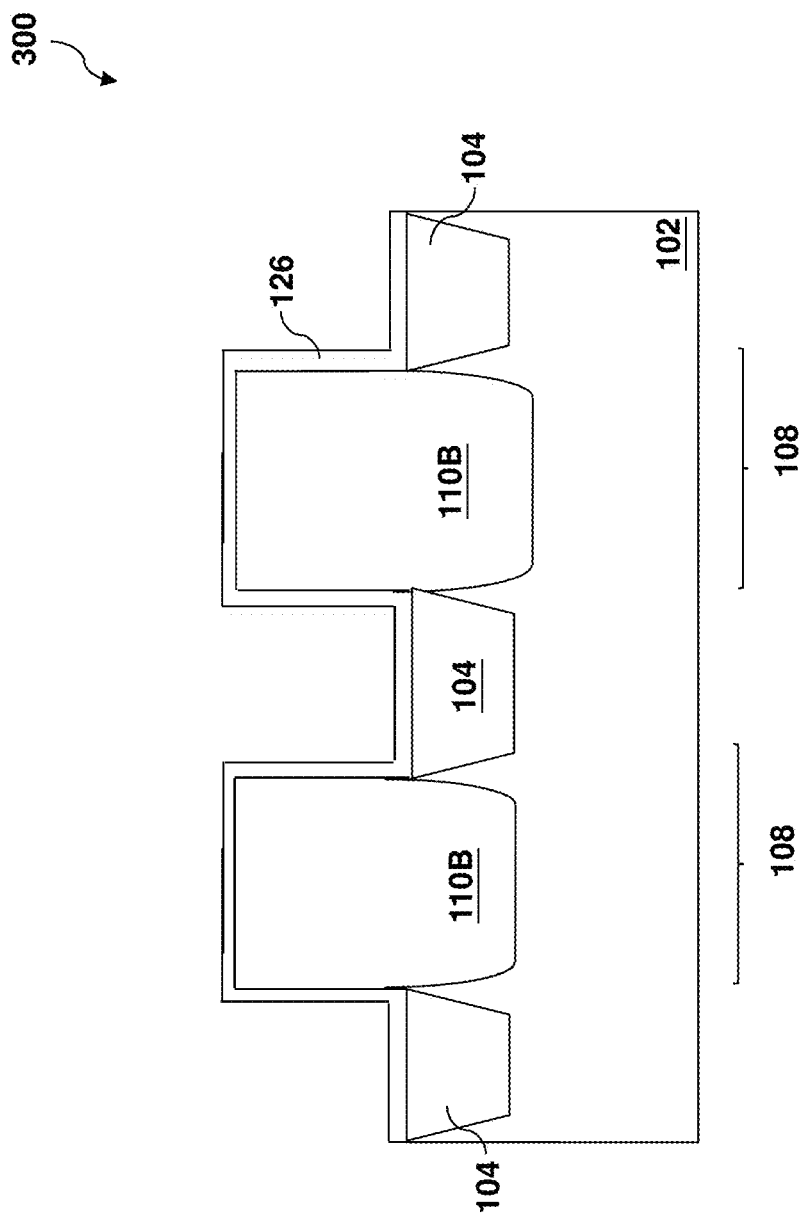
Figure 11A:
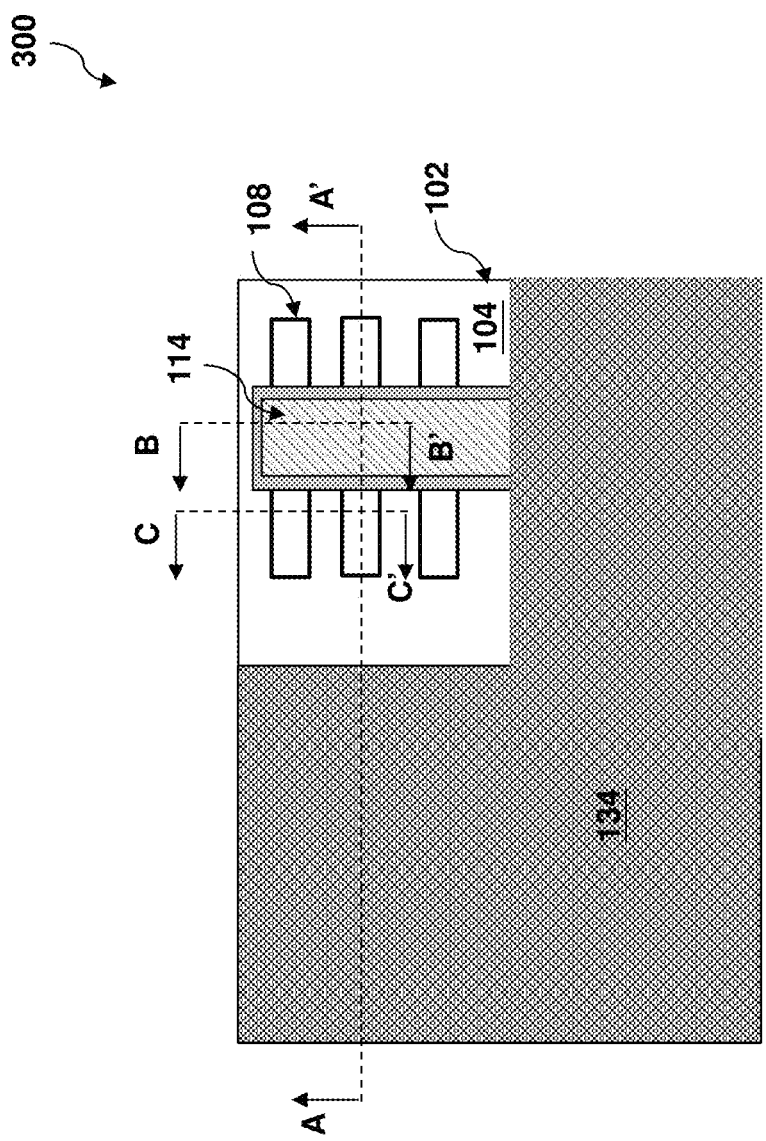
Figure 11B:
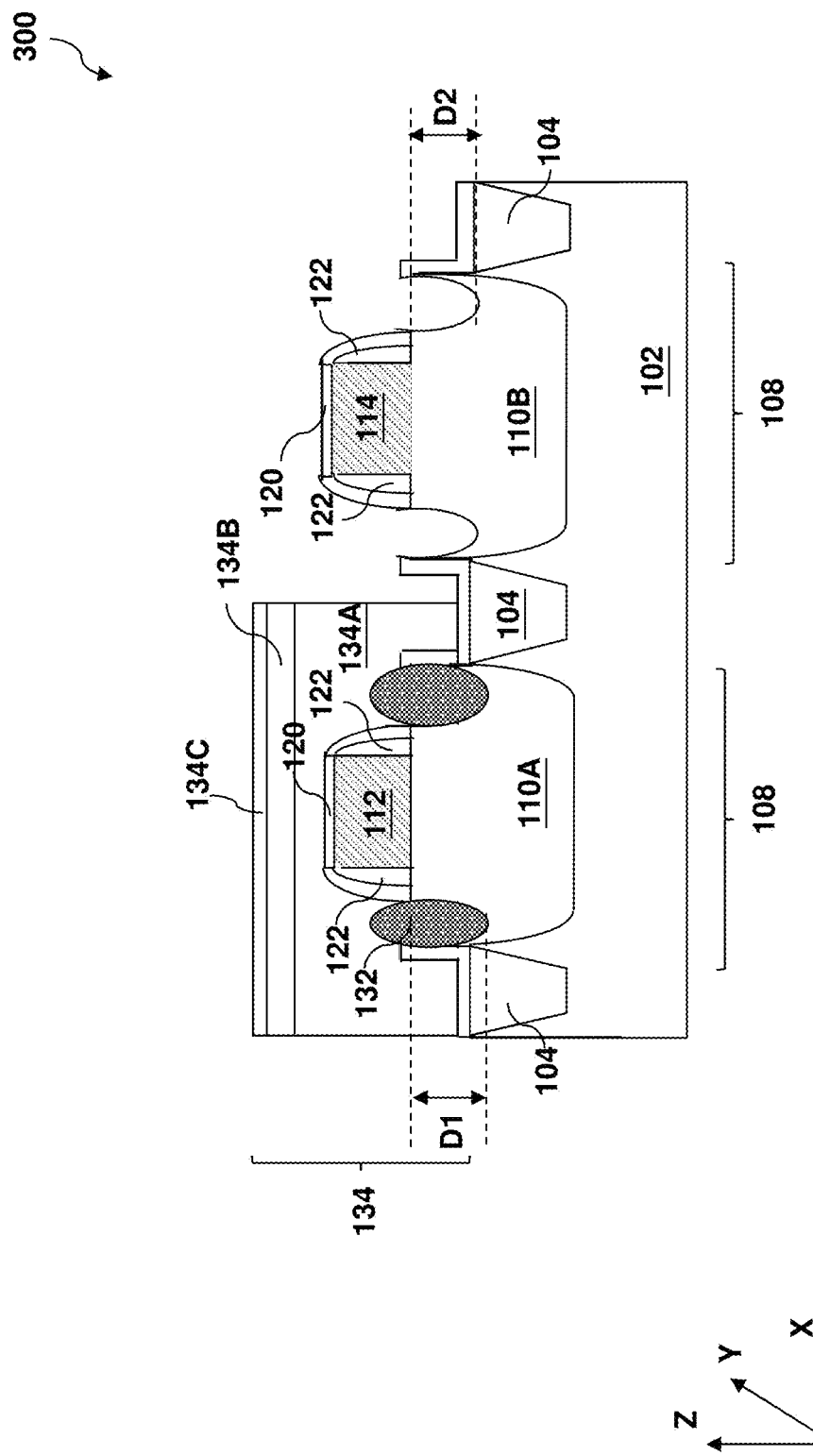
Figure 11C:
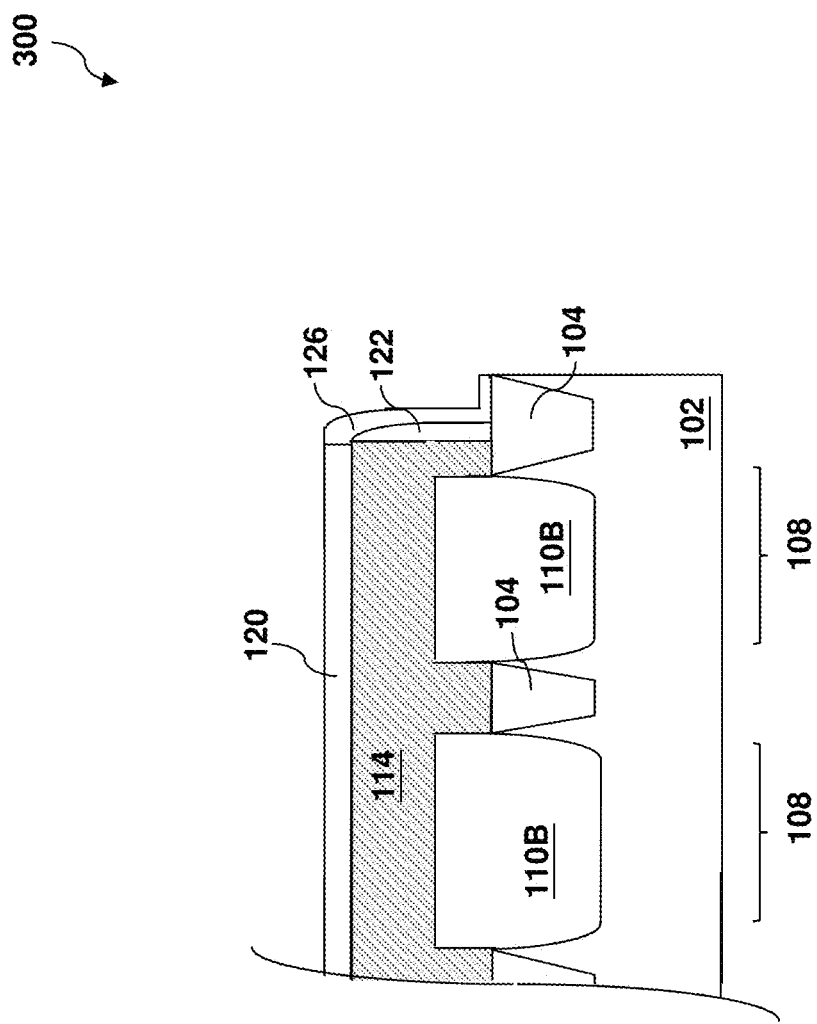
Figure 11D:
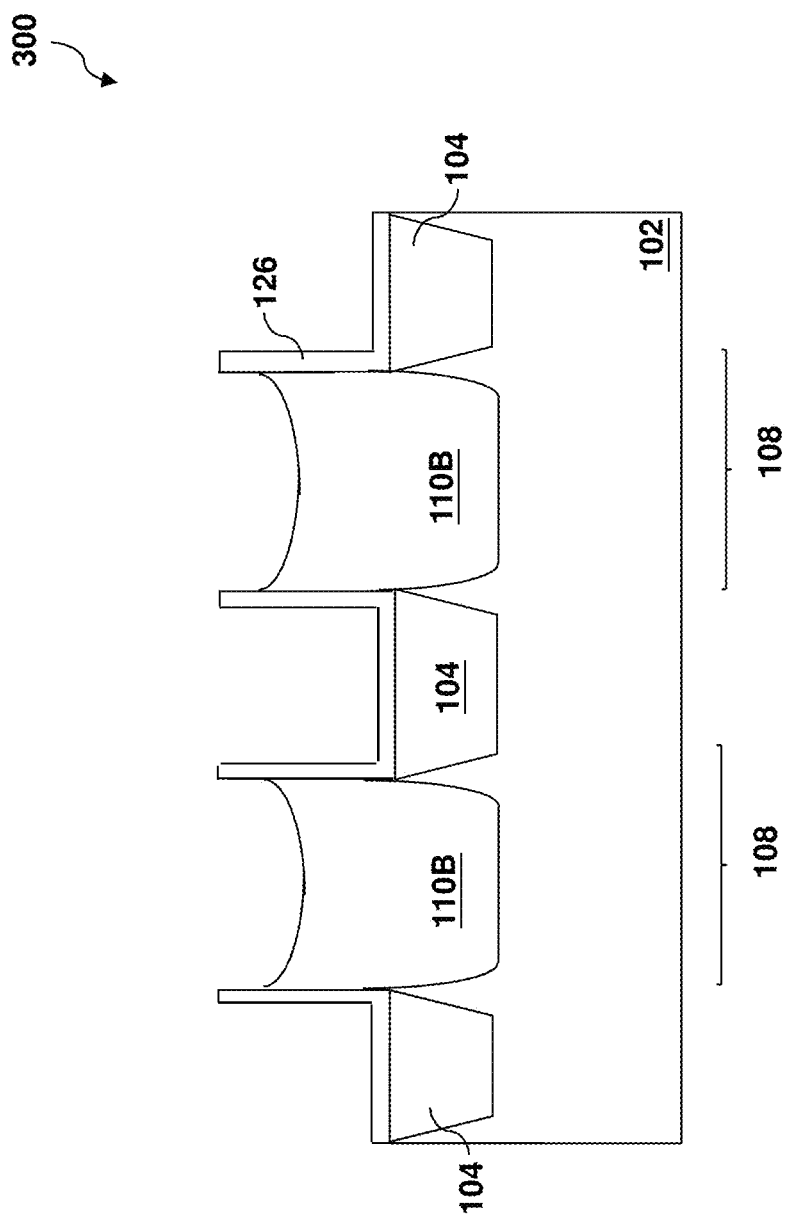
Figure 12A:
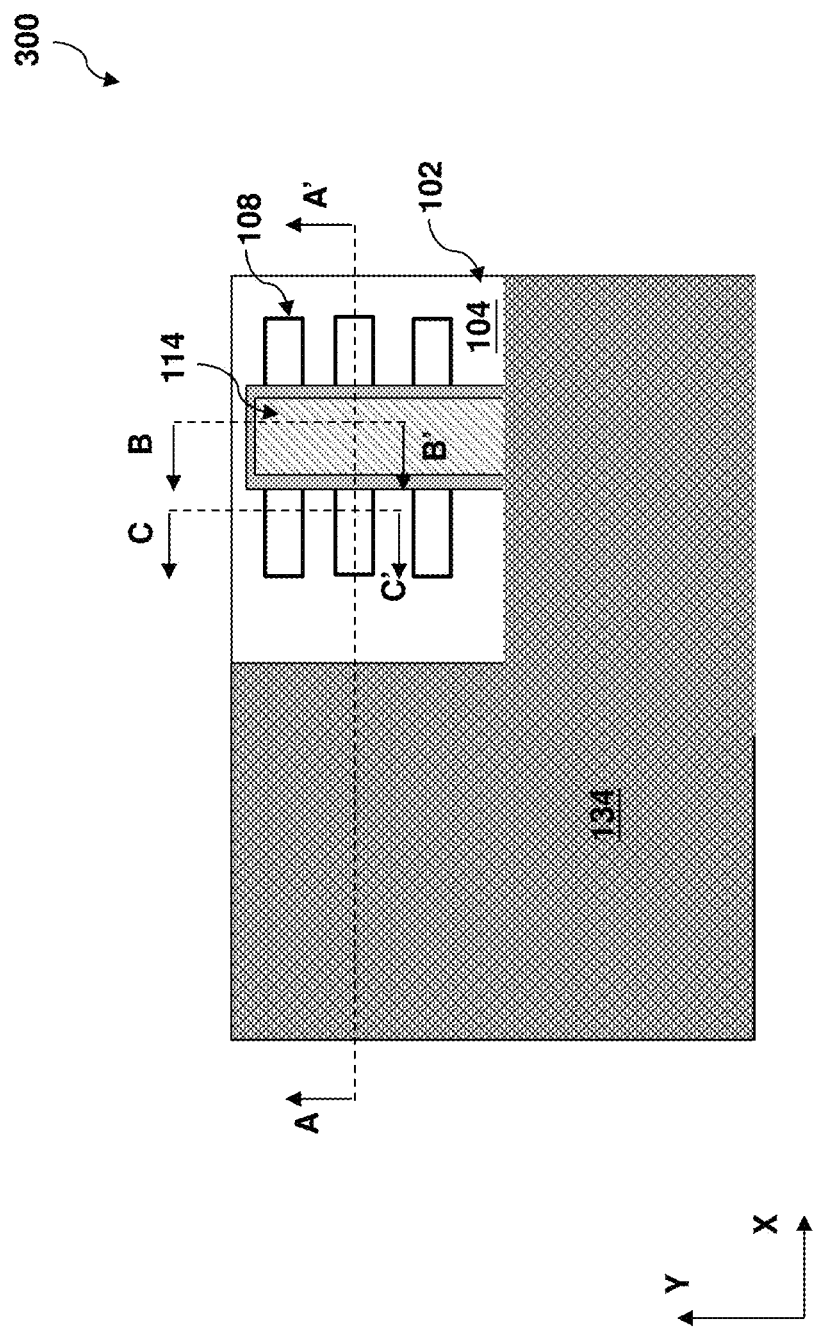
Figure 12B:
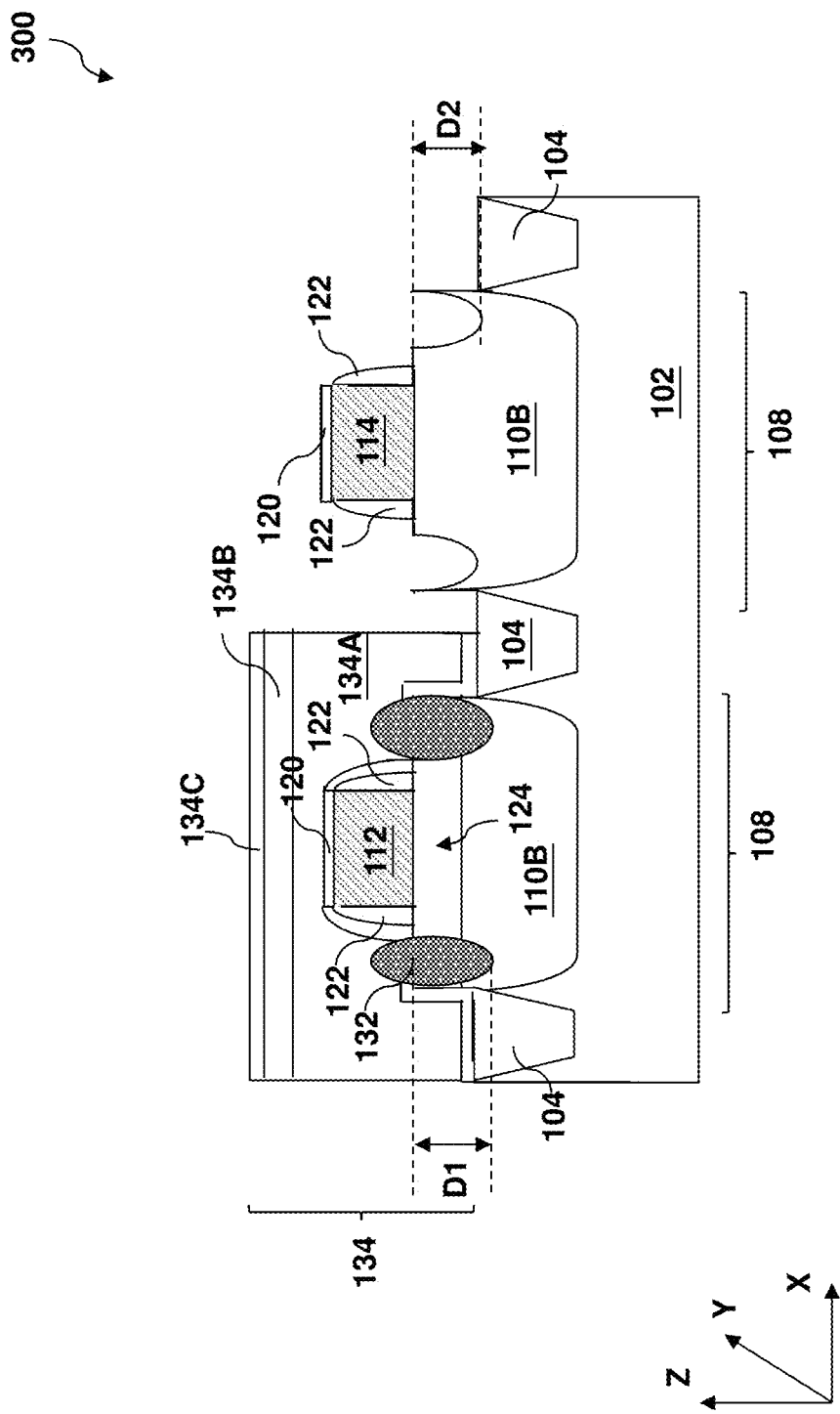
Figure 12C:
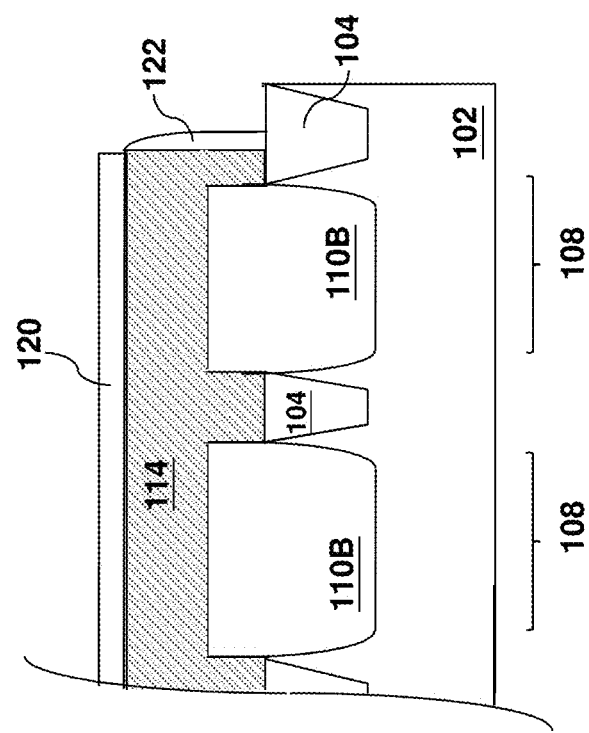
Figure 12D:
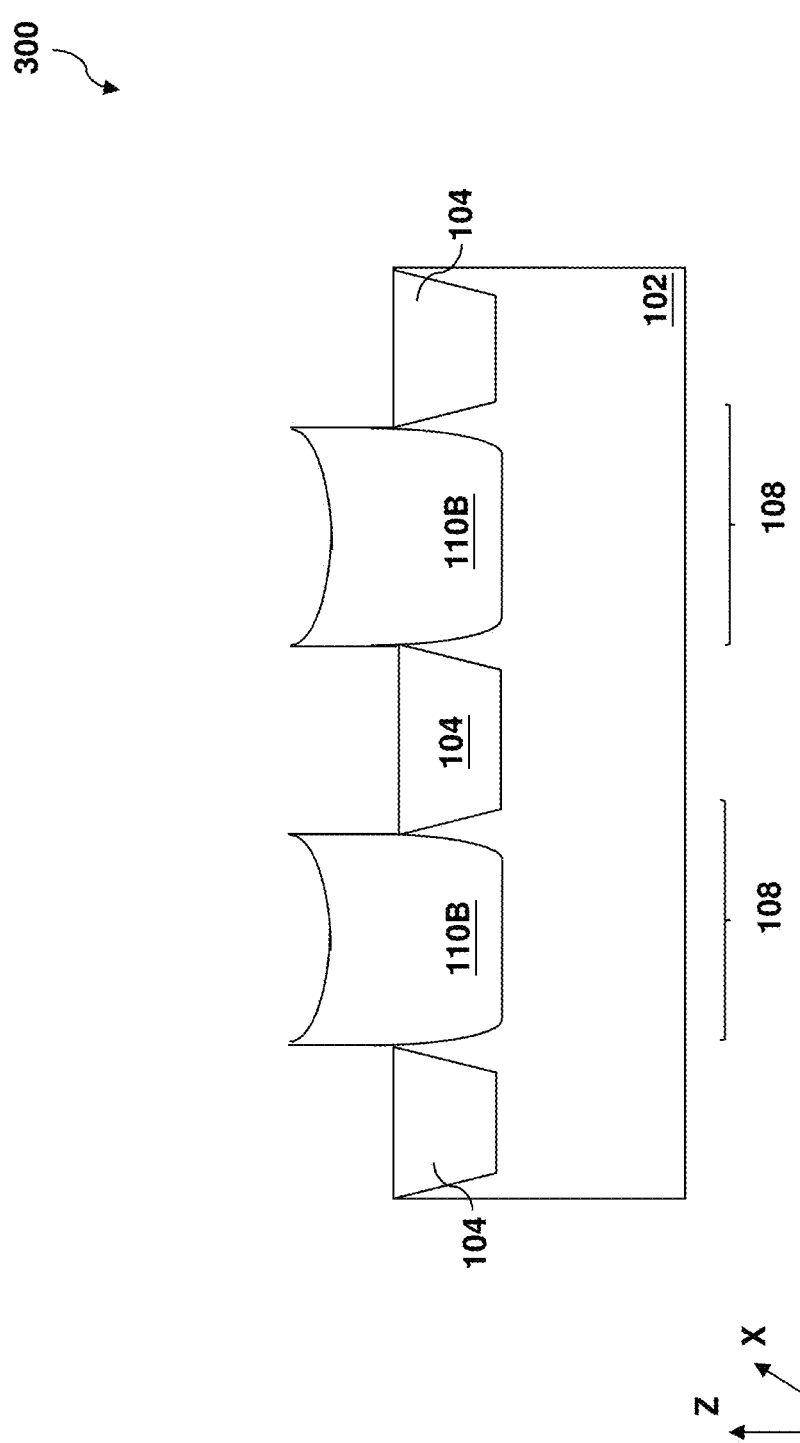

Referring to block 228 of FIG. 2 and to FIGS. 10A-10D, the method 200 proceeds to an operation to form a patterned photoresist layer 134 with an opening to expose second source/drain regions within a second area of the workpiece 300. In some embodiment, the second area includes various devices to be formed, such as memory devices. For examples, the memory devices may include static random access memory devices. The patterned photoresist layer 134 is formed by lithography process with an opening defining the second area, as illustrated in FIG. 10A. In the present embodiment, the photoresist layer 134 is a tri-layer photoresist similar to that of the photoresist layer 130. For examples, the patterned photoresist layer 134 includes a bottom layer 134A, a middle layer 134B and photosensitive layer 134C to enhance lithography process with high resolution and etch resistance, as illustrated in FIG. 10B.

Referring to block 230 of FIG. 2 and to FIGS. 11A-11D, the method 200 may include an operation to perform a shallow recessing process to second source/drain regions within the second area of the workpiece 300. In the present embodiment, the shallow recessing process includes a dry etching process that may include one or more etching step that opens the dielectric layer 126 and recesses the second source/drain regions in the second area. Especially, the dry etching process recesses the second source/drain regions to form trenches with a second depth $D_2$, less than the first depth $D_1$. In some examples, the second depth ranges from 45 nm to 55 nm. In some examples, the dry etching process includes applying an etchant containing carbon oxide and hydrofluoric carbide.

Referring to block 232 of FIG. 2 and to FIGS. 12A-12D, the method 200 proceeds to an operation to perform a fin-sidewall-pull-back (FSWPB) process. The FSWPB process 232 removes or pulls back the dielectric layer 126 on the fin sidewalls in the second region. In the present embodiment, the FSWPB process includes a wet etching process to remove the dielectric layer 126 on the fin sidewalls in the second region. The wet etching process may include one or multiple etching steps to respective etchants to remove various films of the dielectric layer 126. After the FSWPB process, the adjacent fins within the second source/drain regions of the second area are not separated by the dielectric layer 126 and may be merged together during the subsequent epitaxial growth.

Referring to block 234 of FIG. 2 and to FIGS. 13A-13D, an epitaxial process is performed to form second source/drain features 136 on the substrate 102 in the second area. During the epitaxial process, the dummy gate stacks and/or the patterned photoresist layer 134 limit the source/drain features 136 to the source/drain regions in the second area. Suitable epitaxial processes include CVD deposition techniques (e.g., VPE and/or UHV-CVD), molecular beam epitaxy, and/or other suitable processes. The epitaxial process may use gaseous and/or liquid precursors, which interact with the composition of the substrate 102. The source/drain features 136 may be in-situ doped during the epitaxial process by introducing doping species including: p-type dopants, such as boron or $BF_2$; n-type dopants, such as phosphorus or arsenic; and/or other suitable dopants including combinations thereof. If the source/drain features 136 are not in-situ doped, an implantation process (i.e., a junction implant process) is performed to dope the source/drain features 136. In an exemplary embodiment, the source/drain features 136 in an NMOS device include SiP, while those in a PMOS device include GeSnB (tin may be used to tune the lattice constant) and/or SiGeSnB. One or more annealing processes may be performed to activate the source/drain features 136. Suitable annealing processes include rapid thermal annealing (RTA) and/or laser annealing processes.

Particularly, the source/drain features 136 on the adjacent fins are merged together during the epitaxial growth, which enhances the strain effect to the channel region 124 and increases the contact areas to the source/drain contact. In some embodiments, an air gap 138 is formed between the epitaxial grown source/drain feature 136 and the isolation feature 104 between the adjacent fins 108, as illustrated in FIG. 13D. The air gap 138 provides additional isolation function to the source/drain feature 136 in the second area. After the formation of the second source/drain features 136, the patterned photoresist layer 134 is removed by a suitable procedure similar to that of the patterned photoresist layer 130. Due to the different depths $D_1$ and $D_2$, the bottom surface of the first source/drain features 132 is below the bottom surface of the second source/drain features 136. The first source/drain features 132 are portions of a first FET 152 and the second source/drain features 136 are portions of a second FET 154.

Figure 14B:
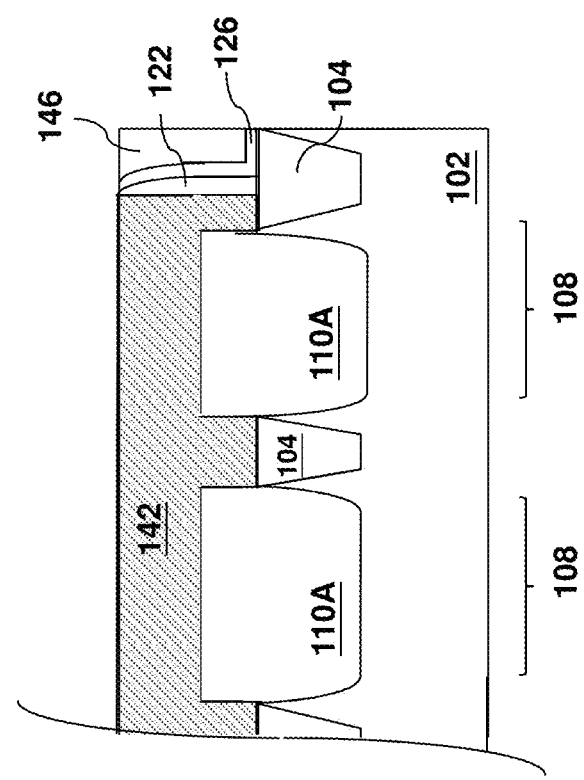
FIGS. 14B, 14C, 14D, 14E, and 14F are sectional views of the workpiece of FIG. 14A, in portion, taken along the dashed lines AA', BB', CC', DD', and EE', respectively, according to various aspects of the present disclosure.
Figure 14C:
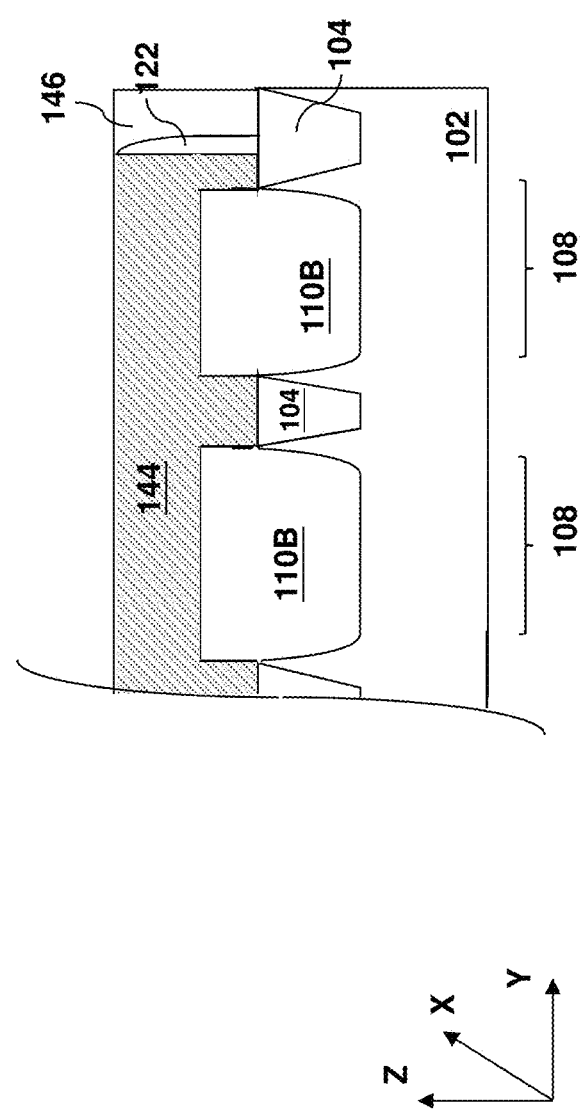
Figure 14D:
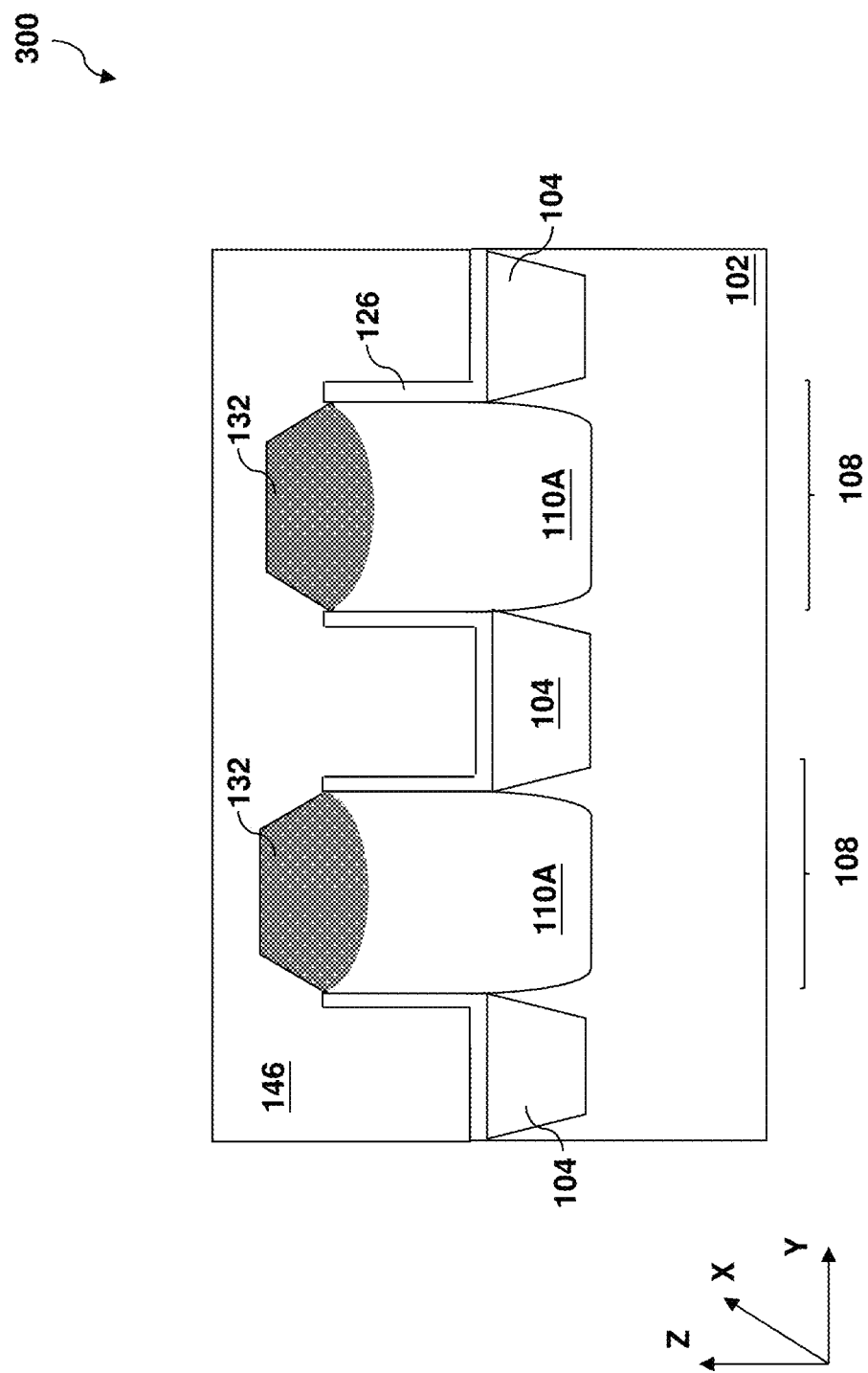
Figure 14E:
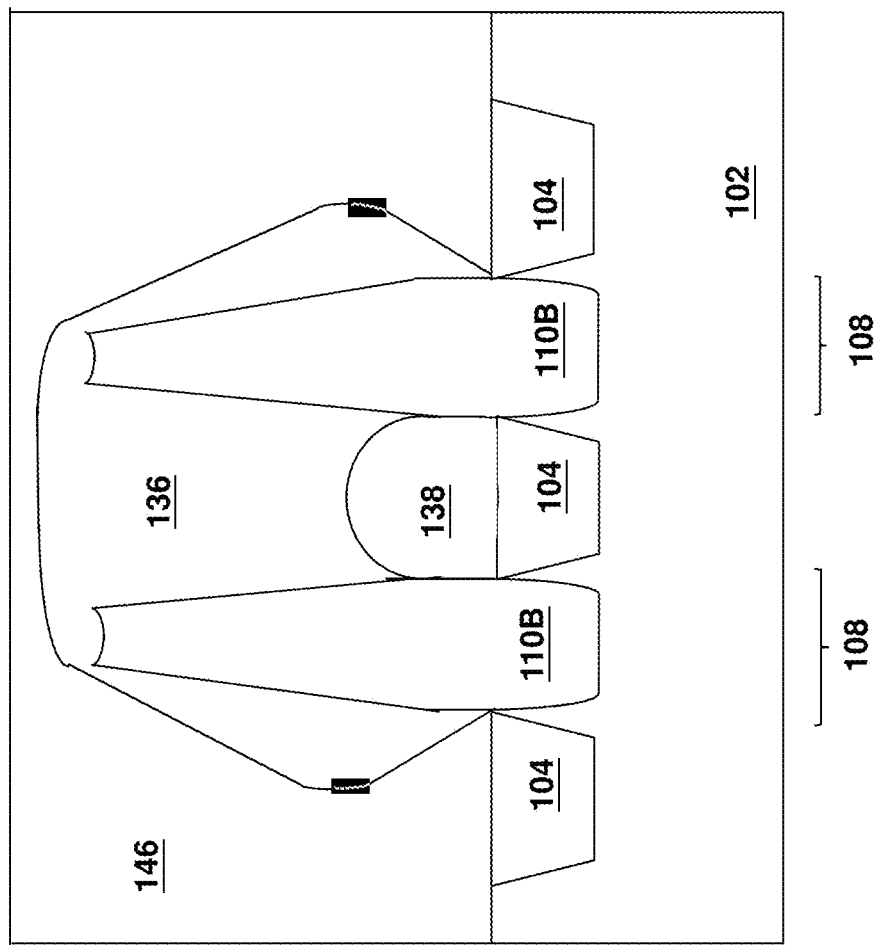

Referring back to block 216 of FIG. 1 and to FIGS. 14A-14F, the method 200 proceeds to form metal gate stacks to replace the dummy gate stacks. FIG. 14A is a top view of the workpiece 300 and FIGS. 14B-14F are sectional views of the workpiece 300, in portion, taken along the dashed lines AA', BB', CC', DD', and EE', respectively in accordance with some embodiments. For examples, the operation 216 forms a metal gate stack 142 to replace the dummy gate stack 112 as illustrated in FIG. 14B and a metal gate stack 144 to replace the dummy gate stack 114 as illustrated in FIG. 14C. The metal gate stack 142 is portion of the first FET 152 and the metal gate stack 144 is portion of the second FET 154. The formation of the metal gate stacks is further described below.

An inter-layer dielectric (ILD) layer 146 is formed on the workpiece 300 by deposition and polishing such as chemical mechanical polishing (CMP). Note that the ILD layer 146 is drawn to transparent in FIG. 14A in the top view so that various fins 108 and source/drain features (132 and 136) are visible for illustration. The ILD layer 146 acts as an insulator that supports and isolates conductive traces. The ILD layer 146 may include any suitable dielectric material, such as silicon oxide, doped silicon oxide such as borophosphosilicate glass (BPSG), tetraethylorthosilicate (TEOS) oxide, un-doped silicate glass, fluorinated silica glass (FSG), phosphosilicate glass (PSG), boron doped silicon glass (BSG), silicon nitride, silicon oxynitride, silicon carbide, low-k dielectric material, other suitable materials, and/or combinations thereof. The ILD layer 146 may be deposited by a PECVD process, a flowable CVD (FCVD) process, or other suitable deposition technique. A CMP process may follow to remove excessive dielectric materials and planarize the top surface. The hard mask 120 may be removed by the CMP. Alternatively, the hard mask 120 may function as polishing stop layer and is removed by additional etching process after the CMP.

The dummy gate stacks (such as 112 and 114), or portions thereof, are removed by etching, respectively or collectively. A selective etching process is applied to remove the dummy gate materials, such as polysilicon, resulting in gate trenches. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.). In some embodiments, etching includes multiple etching steps with different etching chemistries, each targeting a particular material of the dummy gate layers.

The gate trenches are filled by gate materials, such as gate dielectric layer and gate electrode, each including one or more material layers. In some such embodiments, the gate dielectric layer is deposited on the workpiece 300 by any suitable technique, such as ALD, CVD, metal-organic CVD (MOCVD), PVD, thermal oxidation, combinations thereof, and/or other suitable techniques. The gate dielectric layer may include a high-k dielectric material, such as a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials. Likewise, a gate electrode is deposited on the gate dielectric layer. In particular, the gate electrode is electrically conductive. In various examples, the gate electrode may include a single layer or multiple layers, such as a metal layer, a liner layer, a wetting layer, and/or an adhesion layer. The gate electrode layer may further include a work function metal layer and a metal fill layer. The work function metal layer may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbonitride (TaCN), tantalum silicon nitride (TaSiN), or combinations thereof. The p-type or n-type work function metal layer may further include a plurality of layers and may be deposited by CVD, PVD, and/or other suitable process. The metal fill layer may include aluminum (Al), tungsten (W), or copper (Cu) and/or other suitable materials. The metal fill layer may be formed by CVD, PVD, plating, and/or other suitable processes. After the deposition of the metal gate materials, a CMP process is performed to produce a substantially planar top surface of the metal gate stacks.

Figure 14F:
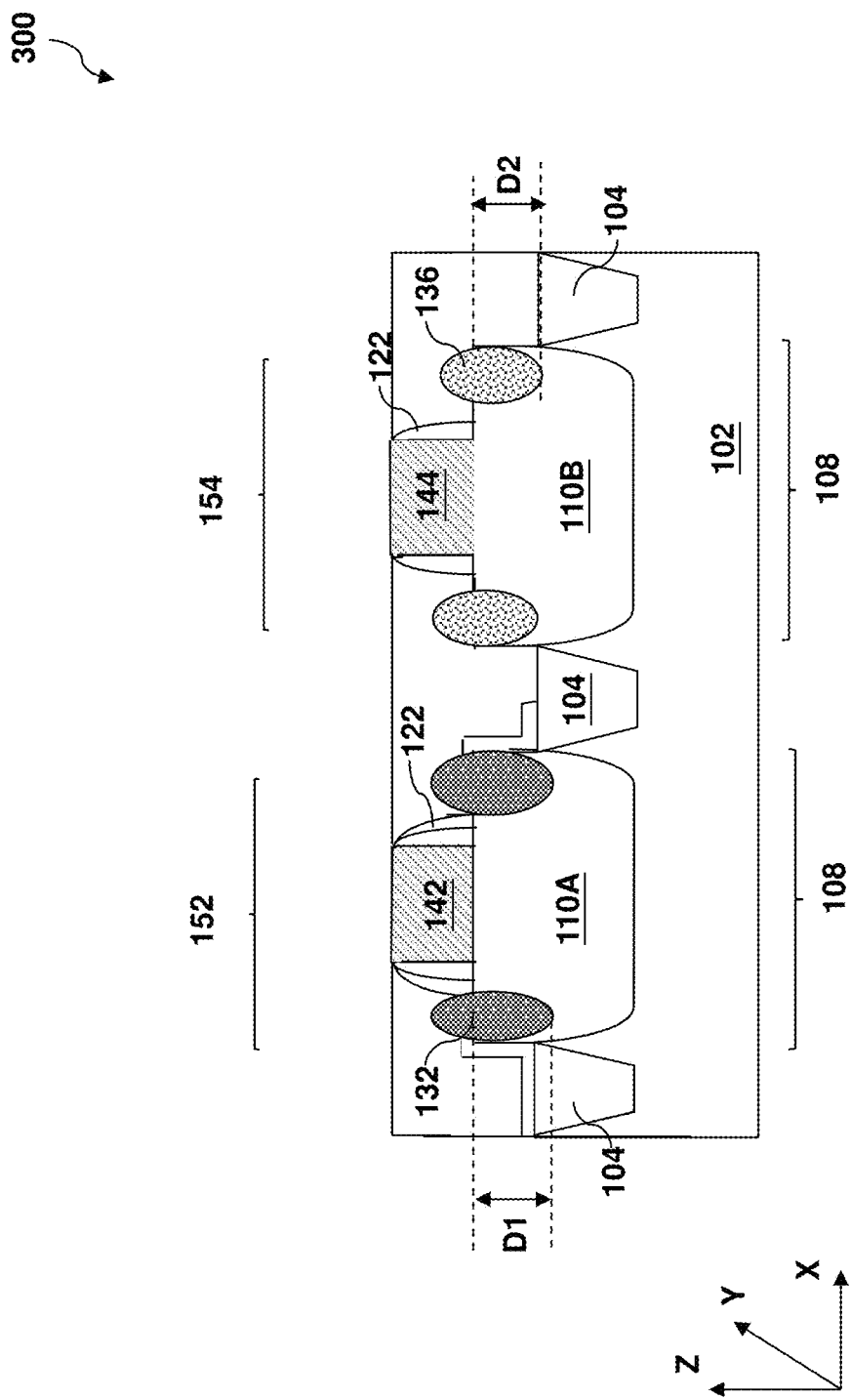

Thus, various devices including various FETs are formed on the substrate 102 with respective structure and procedure. Especially, the first and second source/drain features are formed by different processes and lead to respective structures as described above and further illustrated in FIGS. 14D and 14E, respectively. For an example as-illustrated in FIG. 14E, the source/drain features 136 are directly formed on the sidewalls of the corresponding fin with enhanced carrier mobility. The source/drain features 136 from the adjacent fins are merged together to form common source/drain features with reduced contact resistance. The source/drain features 136 have a bottom surface higher than the bottom surface of the source/drain features 132 due to different depths $D_1$ and $D_2$, as illustrated in FIG. 14F.

The method 200 may proceed to further processes in order to complete the fabrication of the workpiece 300. For example, the method may proceed to operation 218 to form an interconnection structure to couple various devices to an integrated circuit. The interconnection structure includes metal lines in multiple metal layers for horizontal coupling and vias/contacts for vertical coupling between adjacent metal layers or between a bottom metal layer and the device features on substrate 102 (such as source/drain features and gate stacks). The interconnect structure include one or more suitable conductive material, such as copper, aluminum alloy, tungsten, silicide or other suitable conductive material. The interconnection structure may be formed by damascene process, such as single damascene process or dual damascene process, which include, lithography patterning, etching deposition and CMP. For example, the conductive material can be deposited using suitable process, such as CVD, PVD, plating, and or other suitable processes. The illustrated workpiece 300 is merely an example of some embodiments of the method 200. The method 200 may have various other embodiments without departure of the scoped the present disclosure.

Furthermore, the semiconductor structure 200 as shown above may be intermediate devices fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

The present disclosure provides a semiconductor structure and a method making the same. The method includes different procedure to form epitaxially grown source/drain features for various devices. Although not intended to be limiting, one or more embodiments of the present disclosure provides many benefits to a semiconductor device and the formation thereof, including FinFETs. For example, the two types of FETs are formed by different procedures. The first type may be logic devices and the second type may be memory devices. Especially, the second source/drain features for the second type FETs are formed by a procedure including a FSWPB process, which reduces the contact resistance and enhances the carrier mobility. The disclosed method provides freedom to treat different FETs differently and independently to meet respect specifications. However, the first-type FETs and the second type FETs are not limited to logic devices and memory devices, and can be other type devices with different specifications. For example, the first type FETs are p-type FETs and the second type FETs are n-type FETs, or vise verse according to the design consideration.

Thus, the present disclosure provides examples of a method making a semiconductor structure. The method includes forming a fin structure on the substrate, wherein the fin structure includes a first fin active region; a second fin active region; and an isolation feature separating the first and second fin active regions; forming a first gate stack on the first fin active region and a second gate stack on the second fin active region; performing a first recessing process to a first source/drain region of the first fin active region by a first dry etch; performing a first epitaxial growth to form a first source/drain feature on the first source/drain region; performing a fin sidewall pull back (FSWPB) process to remove a dielectric layer on the second fin active region; and performing a second epitaxial growth to form a second source/drain feature on a second source/drain region of the second fin active region.

The present disclosure also provides examples of a semiconductor structure. A semiconductor device. The semiconductor structure includes a semiconductor substrate; first and second fin active regions extending from the semiconductor substrate; a first field-effect transistor on the first fin active region; and a second field-effect transistor on the second fin active region. The first field-effect transistor includes a first gate stack disposed on a first channel region of the first fin active region and first epitaxial grown source/drain features disposed on opposite sides of the first channel region. The second field-effect transistor includes a second gate stack disposed on a second channel region of the second fin active region and second epitaxial source/drain features disposed on opposite sides of the second channel region. The first epitaxial grown source/drain features has a bottom surface below a bottom surface of the second epitaxial grown source/drain features.

The present disclosure provides other examples of a method making a semiconductor structure. The method includes forming a fin structure on the substrate, wherein the fin structure includes a first fin active region; a second fin active region; and an isolation feature separating the first and second fin active regions; forming a first gate stack on the first fin active region and a second gate stack on the second fin active region; performing a first recessing process to a first source/drain region on the first fin active region, wherein the first recessing process includes a first dry etch to recess the first fin active region; performing a first epitaxial growth to form a first source/drain feature on the first source/drain region; performing a second recessing process to a second source/drain region on the second fin active region, wherein the second recessing process includes a second dry etch to recess the second fin active region and a fin sidewall pull back (FSWPB) process to remove a dielectric layer on the second fin active region; and performing a second epitaxial growth to form a second source/drain feature on the second source/drain region. The first dry etch recesses the first fin active region to a first depth; the second dry etch recesses the second fin active region to a second depth; and the second depth is less than the first depth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure on a substrate, wherein the fin structure includes a first fin active region; a second fin active region; and an isolation feature separating the first and second fin active regions;
    forming a first gate stack on the first fin active region and a second gate stack on the second fin active region;
    performing a first recessing process to a first source/drain region of the first fin active region by a first dry etch;
    performing a first epitaxial growth to form a first source/drain feature on the first source/drain region;
    performing a fin sidewall pull back (FSWPB) process to remove a dielectric layer on the second fin active region; and
    performing a second epitaxial growth to form a second source/drain feature on a second source/drain region of the second fin active region.

2. The method of claim 1, further comprising performing a second recessing process to the second source/drain region of the second fin active region by a second dry etch prior to the performing a FSWPB process to remove a dielectric layer on the second fin active region, wherein
    the first dry etch recesses the first fin active region to a first depth;
    the second dry etch recesses the second fin active region to a second depth; and
    the second depth is less than the first depth.

3. The method of claim 2, wherein the first depth ranges between 55 nm and 65 nm and the second depth ranges between 45 nm and 55 nm.

4. The method of claim 1, wherein the FSWPB process includes a wet etching process to selectively remove the dielectric layer on the sidewall of the second fin active region.

5. The method of claim 4, wherein the performing of the second epitaxial growth to form the second source/drain feature on the second source/drain region includes forming the second source/drain feature directly on sidewalls of the second fin active region.

6. The method of claim 4, wherein the performing of the second epitaxial growth to form the second source/drain feature on the second source/drain region includes forming the second source/drain feature, resulting in an air gap between the second source/drain feature and the isolation feature.

7. The method of claim 4, wherein the performing of the second epitaxial growth to form the second source/drain feature on the second source/drain region includes forming a merged source/drain feature landing on both the fin active region and an adjacent fin active region.

8. The method of claim 1, further comprising: depositing the dielectric layer on the first and second fin active regions, wherein the performing of the FSWPB process to remove the dielectric layer on the second fin active region further includes
    forming a patterned mask to cover the first fin active region; and
    applying a wet etching to selectively remove the dielectric layer on the second fin active region.

9. The method of claim 8, wherein the performing of the first epitaxial growth to form the first source/drain feature on the first source/drain region includes forming the first source/drain feature on sidewalls of the first fin active region with the dielectric layer interposed therebetween.

10. The method of claim 1, wherein the first gate stack and the first source/drain features are configured as portions of a first field-effect transistor and the second gate stack and the second source/drain feature are configured as portions of a second field-effect transistor.

11. The method of claim 10, wherein the first field-effect transistor is a field-effect transistor of a first type conductivity and the second field-effect transistor is a field-effect transistor of a second type conductivity opposite to the first type conductivity.

12. The method of claim 10, wherein the first field-effect transistor is a logic device and the second field-effect transistor is a memory device.

13. The method of claim 1, wherein each of the first and second dry etches includes an etchant containing carbon oxide and hydrofluoric carbide.

14. A method, comprising:
forming a fin structure on the substrate, wherein the fin structure includes a first fin active region; a second fin active region; and an isolation feature separating the first and second fin active regions;
forming a first gate stack on the first fin active region and a second gate stack on the second fin active region;
depositing a dielectric layer on the first and second gate stacks;
performing a first recessing process to a first source/drain region of the first fin active region by a first dry etch;
performing a first epitaxial growth to form a first source/drain feature on the first source/drain region;
performing a second recessing process to a second source/drain region of the second fin active region by a second dry etch;
performing a fin sidewall pull back (FSWPB) process to remove portions of the dielectric layer on the second fin active region; and
performing a second epitaxial growth to form a second source/drain feature on the second source/drain region, wherein the first dry etch recesses the first fin active region to a first depth; the second dry etch recesses the second fin active region to a second depth; and the second depth is less than the first depth.

15. The method of claim 14, wherein
the FSWPB process includes a wet etching process to selectively remove the dielectric layer on the sidewall of the second fin active region; and
the performing of the second epitaxial growth to form the second source/drain feature on the second source/drain region includes forming the second source/drain feature directly on sidewalls of the second fin active region.

16. A method, comprising:
forming a fin structure on a substrate, wherein the fin structure includes a first fin active region; a second fin active region; and an isolation feature separating the first and second fin active regions;
forming a first gate stack on the first fin active region and a second gate stack on the second fin active region;
performing a first recessing process of a first depth to a first source/drain region of the first fin active region by a first dry etch;
performing a first epitaxial growth to form a first source/drain feature on the first source/drain region;
performing a second recessing process of a second depth to the second source/drain region of the second fin active region by a second dry etch, the second depth being less than the first depth;
performing a fin sidewall pull back (FSWPB) process to remove a dielectric layer on the second fin active region; and
performing a second epitaxial growth to form a second source/drain feature on a second source/drain region of the second fin active region.

17. The method of claim 16, wherein
wherein each of the first and second dry etches includes an etchant containing carbon oxide and hydrofluoric carbide;
the FSWPB process includes a wet etching process to selectively remove the dielectric layer on the sidewall of the second fin active region; and
the performing of the second epitaxial growth to form the second source/drain feature on the second source/drain region includes forming the second source/drain feature directly on sidewalls of the second fin active region, thereby forming an air gap between the second source/drain feature and the isolation feature.

18. The method of claim 17, wherein the performing of the second epitaxial growth to form the second source/drain feature on the second source/drain region includes forming a merged source/drain feature landing on both the fin active region and an adjacent fin active region.

19. The method of claim 18, further comprising: depositing the dielectric layer on the first and second fin active regions, wherein the performing of the FSWPB process to remove the dielectric layer on the second fin active region further includes
forming a patterned mask to cover the first fin active region; and
applying a wet etching to selectively remove the dielectric layer on the second fin active region.

20. The method of claim 19, wherein the performing of the first epitaxial growth to form the first source/drain feature on the first source/drain region includes forming the first source/drain feature on sidewalls of the first fin active region with the dielectric layer interposed therebetween.

* * * * *